United States Patent
Shibazaki

(10) Patent No.: US 10,678,152 B2
(45) Date of Patent: Jun. 9, 2020

(54) LAYOUT METHOD, MARK DETECTION METHOD, EXPOSURE METHOD, MEASUREMENT DEVICE, EXPOSURE APPARATUS, AND DEVICE MANUFACTURING METHOD

(71) Applicant: NIKON CORPORATION, Tokyo (JP)

(72) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/714,703

(22) Filed: Sep. 25, 2017

(65) Prior Publication Data

US 2018/0088474 A1    Mar. 29, 2018

Related U.S. Application Data

(63) Continuation of application No. PCT/JP2016/059595, filed on Mar. 25, 2016.

(30) Foreign Application Priority Data

Mar. 25, 2015   (JP) ................. 2015-061958

(51) Int. Cl.
 *G03F 9/00* (2006.01)
 *G03F 7/20* (2006.01)
 *H01L 21/68* (2006.01)

(52) U.S. Cl.
 CPC .............. *G03F 9/7088* (2013.01); *G03F 7/70* (2013.01); *G03F 9/708* (2013.01); *H01L 21/68* (2013.01)

(58) Field of Classification Search
 CPC ................................ G03F 9/708; G03F 9/7084
 See application file for complete search history.

(56) References Cited

U.S. PATENT DOCUMENTS 4,780,617 A    10/1988   Umatate et al.
4,861,162 A    8/1989    Ina
(Continued)

FOREIGN PATENT DOCUMENTS

| EP | 1 420 298 A2 | 5/2004 |
|----|---|---|
| JP | 2010-251362 A | 11/2010 |
| WO | 2004/055803 A1 | 7/2004 |

OTHER PUBLICATIONS

Jun. 21, 2016 International Search Report issued in International Patent Application No. PCT/JP2016/059595.
(Continued)

*Primary Examiner* — Steven Whitesell Gordon
(74) *Attorney, Agent, or Firm* — Oliff PLC

(57) ABSTRACT

On a substrate conforming to a layout method for a plurality of marks for detection using a plurality of mark detection systems of which the detection centers are arranged at a predetermined spacing along an X-axis direction, a plurality of shot areas are formed in both an X-axis direction and a Y-axis direction orthogonal thereto in an XY plane, and sets including at least two marks separated in the X-axis direction are repeatedly arranged along the X-axis direction at spacing of a length in the X-axis-direction of each shot area, and the marks belonging to each set are separated from each other in the X-axis direction by a spacing determined based arrangement in the X-axis direction of the plurality of mark detection systems and the length. It is thereby possible to reliably detect a plurality of marks on a substrate using a plurality of mark detection systems.

19 Claims, 21 Drawing Sheets

(56) References Cited

U.S. PATENT DOCUMENTS

| | | |
|---|---|---|
| 5,151,750 A | 9/1992 | Magome et al. |
| 5,448,332 A | 9/1995 | Sakakibara et al. |
| 5,969,441 A | 10/1999 | Loopstra et al. |
| 6,208,407 B1 | 3/2001 | Loopstra |
| 6,242,754 B1 | 6/2001 | Shiraishi |
| 6,590,634 B1 | 7/2003 | Nishi et al. |
| 6,611,316 B2 | 8/2003 | Sewell |
| 6,778,257 B2 | 8/2004 | Bleeker et al. |
| 6,952,253 B2 | 10/2005 | Lof et al. |
| 7,023,610 B2 | 4/2006 | Ohtsuki et al. |
| 7,319,506 B2 | 1/2008 | Den Boef et al. |
| 7,561,280 B2 | 7/2009 | Schluchter et al. |
| 7,589,822 B2 | 9/2009 | Shibazaki |
| 8,054,472 B2 | 11/2011 | Shibazaki |
| 8,432,534 B2 | 4/2013 | Shibazaki |
| 2002/0041377 A1 | 4/2002 | Hagiwara et al. |
| 2003/0025890 A1 | 2/2003 | Nishinaga |
| 2006/0227309 A1 | 10/2006 | Loopstra et al. |
| 2007/0263191 A1* | 11/2007 | Shibazaki ........... G03F 7/70641 355/53 |
| 2009/0233234 A1 | 9/2009 | Shibazaki |
| 2015/0013559 A1* | 1/2015 | Hayashi ................ G03F 7/0002 101/450.1 |

OTHER PUBLICATIONS

Jun. 21, 2016 Written Opinion issued in International Patent Application No. PCT/JP2016/059595.
Jan. 29, 2019 Search Report issued in European Patent Application No. 16768934.8.
Jul. 3, 2019 Office Action issued in Chinese Patent Application No. 201680018342.3.
Jun. 20, 2019 Office Action issued in Taiwanese Patent Application No. 105109643.
Dec. 9, 2019 Office Action issued in Japanese Patent Application No. 2017-508462.
Mar. 3, 2020 Office Action issued in Chinese Patent Application No. 201680018342.3.
Mar. 2, 2020 Office Action issued in Chinese Patent Application No. 201680018342.3.

* cited by examiner

LAYOUT METHOD, MARK DETECTION METHOD, EXPOSURE METHOD, MEASUREMENT DEVICE, EXPOSURE APPARATUS, AND DEVICE MANUFACTURING METHOD

CROSS-REFERENCE TO RELATED APPLICATIONS

This application is a continuation of International Application PCT/JP2016/059595, with an international filing date of Mar. 25, 2016, the disclosure of which is hereby incorporated herein by reference in its entirety, which was not published in English.

BACKGROUND OF THE INVENTION

Field of the Invention

The present invention relates to a layout method, a mark detection method, an exposure method, a measurement device, an exposure apparatus, and a device manufacturing method, and more particularly to a layout method of a plurality of marks to be formed on a substrate, a mark detection method to detect the plurality of marks formed on the substrate, an exposure method using the mark detection method, a measurement device to measure position information of the plurality of marks formed on the substrate, an exposure apparatus equipped with the measurement device, and a device manufacturing method using the exposure method or the exposure apparatus.

Description of the Background Art

In a lithography process to produce semiconductor devices or the like, multilayered circuit patterns are overlaid and formed on a substrate such as a wafer or a glass plate (hereinafter generally referred to as a wafer), however, when the overlay accuracy between each layer is poor, the semiconductor devices or the like will not be able to demonstrate predetermined circuit characteristics and in some cases become a defective product. Therefore, normally, a mark (alignment mark) is to be formed in advance in each of a plurality of shot areas and position (coordinate values) of the mark on a stage coordinate system of an exposure apparatus is to be detected. Thereafter, based on this mark position information and a known position information of a pattern to be newly formed (e.g. a reticle pattern), wafer alignment is performed in which positioning is performed of a shot area on a wafer with respect to the pattern.

As the wafer alignment method, enhanced global alignment (EGA) is the mainstream in which alignment marks are detected only for some shot areas (also referred to as sample shot, areas or alignment shot areas) on the wafer and arrangement of the shot areas on the wafer is calculated using a statistical technique, considering balance with throughput. To obtain the arrangement of the shot areas on the wafer with high precision by EGA, the number of sample shot areas has to be increased so that more alignment marks are detected.

As a method of detecting more alignment marks without dropping the throughput as much as possible, for example, detecting a plurality of marks at once using a plurality of mark detection systems (alignment detection systems) can be considered. However, a shot map of a wafer (data concerning arrangement of shot areas formed on the wafer) varies, along with variation, of the size of the shot areas and the arrangement of the marks. Accordingly, to be able to cope with the various shot maps, an exposure apparatus is known that has a part of alignment detection systems of a plurality of alignment detection systems variable so that spacing between alignment detection systems is made variable (for example, refer to U.S. Pat. No. 8,432,534).

However, movable alignment detection systems had more design limitations than fixed alignment detection systems, and also had disadvantages in cost.

SUMMARY OF THE INVENTION

According to a first aspect, there is provided a layout method of a plurality of marks to be formed on a substrate for detection using N mark detection systems being two or more whose detection centers are arranged at a predetermined spacing along a first direction within a predetermined plane, wherein a plurality of divided areas are formed on the substrate in the first direction and a second direction intersecting the first direction within the predetermined plane, and sets of marks to which at least two marks arranged apart in the first direction belong are repeatedly arranged along the first direction at a spacing of a length in the first direction of the divided area, and marks belonging to each of the sets are arranged separate from one another in the first direction by a spacing determined based on an arrangement of the N mark detection systems in the first direction and the length.

According to a second aspect, there is provided a layout method of a plurality of marks to be formed on a substrate for detection using N mark detection systems being two or more, wherein a plurality of divided areas are to be set in a first direction and a second direction intersecting the first direction on the substrate, and arrangement of at least one mark to be formed in each of the plurality of divided areas is decided based on each detection position of the N mark detection systems and length in the first direction of the divided area.

According to a third aspect, there is provided a layout method of a plurality of marks to be formed on a substrate for detection using N mark detection systems being two or more, wherein a plurality of divided areas are to be set in a first direction and a second direction intersecting the first direction on the substrate, and arrangement of at least one mark to be formed in each of the plurality of divided areas is decided based on positional relation of detection position of the N mark detection systems in the first direction and length of the divided area in the first direction.

According to a fourth aspect, there is provided a mark detection method, comprising: detecting a plurality of marks formed on a substrate using the layout method according to either the first or the third aspect using the N mark detection systems.

According to a fifth aspect, there is provided a mark detection method to detect a plurality of marks formed on a substrate in a predetermined positional relation using N mark detection systems being two or more whose detection centers are arranged at a predetermined spacing along a first direction within a predetermined plane, comprising: grouping the N mark detection systems into N/2 sets consisting of two mark detection systems different from each other forming a set when the N is an even number and performing parallel detection N/2 times, in which of a plurality of marks formed in advance on the substrate along with a plurality of divided areas, two marks are concurrently detected using a mark detection system of each of the sets, the two marks being selected from a plurality of sets of marks to which at least two marks belong, and the at least two marks are repeatedly placed along the first direction at a spacing by a length in the first direction of the divided area, with mark detection systems of each set arranged apart in the first direction by a distance between the sets in the first direction being a remainder when divided by a length in the first direction of the divided area, and the plurality of divided areas being formed in the first direction and a second direction intersecting the first direction within the predetermined plane, and grouping (N−1) mark detection systems into (N−1)/2 sets with each set consisting of two mark detection systems different from each other and performing detection of two marks selected from the plurality of sets of marks (N−1)/2 times using mark detection systems in each of the sets when the N is an odd number, and the (N−1) mark detection systems that detect one mark on the substrate using a predetermined one of the mark detection systems is a mark detection system in which the predetermined one mark detection system is excluded from the N mark detection systems.

According to a sixth aspect, there is provided a mark detection method to detect a plurality of marks formed on a substrate, wherein a plurality of divided areas are set in a first direction and a second direction intersecting the first direction on the substrate, and at least one mark is formed in each of the plurality of divided areas, and mark detection operation is controlled using the plurality of mark detection systems, based on detection position of each of the plurality of mark detection systems and length in the first direction of the divided areas.

According to a seventh aspect, there is provided a mark detection method to detect a plurality of marks formed on a substrate, wherein a plurality of divided areas are set in a first direction and a second direction intersecting the first direction on the substrate, and at least one mark is formed in each of the plurality of divided areas, and mark detection operation is controlled using the plurality of mark detection systems, based on positional relation of detection position of the plurality of mark detection systems in the first direction and length in the first direction of the divided area.

According to an eighth aspect, there is provided an exposure method, comprising: detecting at least a part of marks of the plurality of marks formed on the substrate using the mark detection method according to either the fourth or the seventh aspect, and moving the substrate based on detection results of the marks and exposing the plurality of divided areas with an energy beam.

According to a ninth aspect, there is provided, a device manufacturing method, including: exposing the substrate using the exposure method according to the eighth aspect, and developing the substrate which has been exposed.

According to a tenth aspect, there is provided a measurement device that measures position information of a plurality of marks formed in a predetermined positional relation on a substrate, comprising: N mark detection systems which are two or more, each detecting a mark and whose detection centers are arranged at a predetermined spacing along a first direction within a predetermined plane; a stage that moves within the predetermined plane while holding the substrate; a position measurement system that measures at least position information within the predetermined plane of the stage; and a controller that controls movement of the stage based on measurement information by the position measurement system, along with measuring position information within the predetermined plane of a measurement target mark based on detection results of the mark detection system detecting the measurement target marks of the plurality of marks and measurement information of the position measurement system at the time of detection, wherein the controller, in a divided area on the substrate and in another divided area, concurrently detects marks at different positions in each of the divided areas as the measurement target mark, using two of the mark detection systems.

According to an eleventh aspect, there is provided a measurement, device that measures position information of a plurality of marks formed in a predetermined positional relation on a substrate, comprising: N mark detection systems which are two or more, each detecting a mark and whose detection centers are arranged at a predetermined spacing along a first direction within a predetermined plane; a stage that moves within the predetermined plane while holding the substrate a position measurement system that measures at least position information within the predetermined plane of the stage; and a controller that controls movement of the stage based on measurement information by the position measurement system, along with measuring position information within the predetermined plane of a measurement target mark based on detection results of the detection system detecting the measurement target, marks of the plurality of marks and measurement information of the position measurement, system at the time of detection, wherein the controller decides sets of the mark detection systems that can concurrently detect two or more marks of a plurality of marks arranged in each of the plurality of divided areas, based on distance in the first direction between detection centers of the N mark detection systems and length in the first, direction of each of a plurality of divided areas formed on the substrate in the first direction and a second direction intersecting the first direction within the predetermined plane, and the two or more marks are detected concurrently as the measurement target mark, using the decided sets of the mark detection systems.

According to a twelfth aspect, there is provided a measurement device that measures position information of a plurality of marks formed in a predetermined positional relation on a substrate, comprising: a plurality of mark detection systems with detection centers arranged at a predetermined spacing along a first direction within a predetermined, plane that detects the marks on the substrate while relatively moving the measurement beam with respect to the substrate within the predetermined plane; a stage that moves within the predetermined plane while holding the substrate; a position measurement system that measures at least position information within the predetermined plane of the stage; and a controller that controls movement of the stage based on measurement information by the position measurement system, along with measuring position information within the predetermined plane of a measurement target mark based on detection results of the detection system detecting the measurement target marks of the plurality of marks and measurement information of the position measurement system at the time of detection, wherein the controller, when detecting marks arranged as the measurement target marks in two divided areas arranged apart in the first direction of a plurality of divided areas formed on the substrate in the first direction and a second direction, intersecting the first direction within the predetermined plane using two of the plurality of mark detection systems, controls a detection operation of scanning a grating mark with measurement beams from each of the two mark detection systems, based on a remainder when a distance in the first direction between detection centers of the two mark detection systems is divided by a length in the first direction of one of the divided areas.

According to a thirteenth aspect, there is provided, a measurement device that detects a plurality of marks formed on a substrate, comprising: a plurality of mark detection systems; and a controller, wherein a plurality of divided areas is set in a first direction and a second direction intersecting the first direction on the substrate, along with at least one mark formed in each of the plurality of divided areas, and the controller controls mark detection operation using the plurality of mark detection systems, based on detection position of each of the plurality of mark detection systems and length in the first direction of the divided areas.

According to a fourteenth aspect, there is provided a measurement device that detects a plurality of marks formed on a substrate, comprising: a plurality of mark detection systems; and a controller, wherein a plurality of divided areas is set in a first, direction and a second direction intersecting the first direction on the substrate, along with at least one mark formed in each of the plurality of divided areas, and the controller controls mark detection operation using the plurality of mark detection systems, based on positional relation in the first direction of detection position of the plurality of mark detection systems and length in the first direction of the divided areas.

According to a fifteenth aspect, there, is provided an exposure apparatus comprising: the measurement device according to either the tenth or the fourteenth aspect that measures position information of at least a plurality of marks which are a part of a plurality of marks formed in a predetermined positional relation on a substrate, and a pattern generating device that generate a pattern by irradiating a plurality of divided areas on a substrate with an energy beam.

According to a sixteenth aspect, there is provided a device manufacturing method, including: exposing the substrate using the exposure apparatus according to the fifteenth aspect, and developing the substrate which has been exposed.

BRIEF DESCRIPTION OF DRAWINGS

In the accompanying drawings;

FIG. 3 is a planar view showing an interferometer that the exposure apparatus in FIG. 1 is equipped with;

DESCRIPTION OF EMBODIMENTS

Hereinafter, an embodiment will be described, based on FIGS. 1 to 16.

Figure 1:
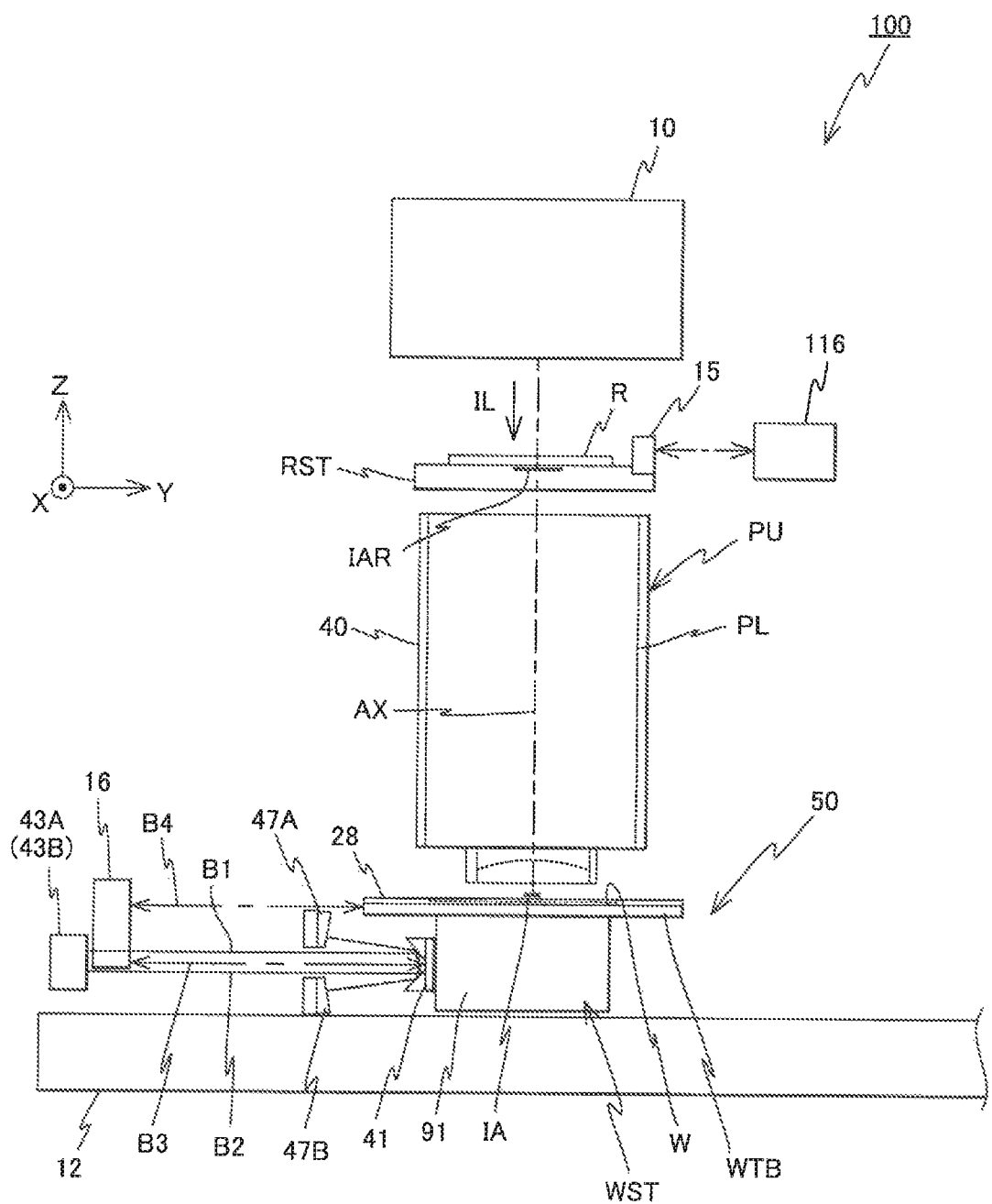
FIG. 1 schematically shows a structure of an exposure apparatus according to an embodiment to which a mark detection method is applied.

In the embodiment, a case in which a mark detection method is applied to an exposure apparatus will be described. FIG. 1 schematically shows a structure of an exposure apparatus 100 to which a mark detection method according to the embodiment is applied. Exposure apparatus 100 is a projection exposure apparatus of a step-and-scan method, or a so called, scanner. As it will be described later on, exposure apparatus 100 is equipped with a projection optical, system PL. In the description below, a direction parallel to an optical axis AX of projection optical system PL will be described as a 2-axis direction, a scanning direction in a plane orthogonal to the Z-axis direction in which a reticle R and a wafer W are relatively scanned will be described as a Y-axis direction, and a direction orthogonal to the Z-axis and the Y-axis will be described as an X-axis direction, and rotation (tilt) directions around the X-axis, the Y-axis, and the Z-axis will be described as θx, θy, and θz directions, respectively.

Exposure apparatus 100 is equipped with an illumination system 10, a reticle stage RST, a projection unit PU, a stage device 50 that has a wafer stage WST, and a controller for these parts. FIG. 1 shows wafer W mounted on wafer stage WST.

Illumination system 10 illuminates a slit-shaped illumination area IAR on reticle R set (limited) by a reticle blind (also called a masking system) by an illumination light (exposure light) IL with an illuminance substantially uniform. The structure of illumination system 10 is disclosed in, for example, U.S. Patent Application Publication No. 2003/0025890 and the like. Here, as an example of illumination light IL, an ArF excimer laser beam (wavelength 193 nm) is used.

On reticle stage RST, reticle R that has a circuit pattern and the like formed on its pattern surface (lower surface in FIG. 1) is fixed, for example, by vacuum suction. Reticle stage RST can be finely moved within an XY plane by a reticle stage drive system 11 (not shown in FIG. 1, refer to FIG. 5) which includes, for example, a linear motor and the like, and can also be moved in a scanning direction (the Y-axis direction which is the lateral direction of the page surface in FIG. 1) at a predetermined scanning speed.

Position information (including rotation information in the θz direction) within the XY plane of reticle stage RST is constantly detected, for example, at a resolution of around 0.25 nm by a reticle laser interferometer (hereinafter referred to as a "reticle interferometer") 116, via a movable mirror 15 (or a reflection surface formed on a surface at an edge of reticle stage RST). Measurement values of reticle interferometer 116 are sent to a main controller 20 (not shown in FIG. 1, refer to FIG. 5).

Projection unit PU is arranged below reticle stage RST in FIG. 1. Projection unit PU includes a barrel 40 and projection optical system PL held within barrel 40. As projection optical system PL, for example, a dioptric system is used consisting of a plurality of optical elements (lens elements) arranged along optical axis AX parallel to the Z-axis direction. Projection optical system PL, for example, is double telecentric and has a predetermined projection magnification (e.g. such as 1/4 times, 1/5 times, or 1/8 times). Reticle R is placed so that its pattern surface almost coincides with a first surface (object plane) of projection optical system PL, and wafer W whose surface is coated with a resist (sensitive agent) is placed at a second surface (image plane) side of projection optical system PL. Therefore, when illumination area IAR on reticle R is illuminated by illumination light IL from illumination optical system IOP, illumination light IL that has passed reticle R forms a reduced image of a circuit pattern of reticle R (a reduced image of a part of the circuit pattern) in illumination area IAR on an area (hereafter also called an exposure area) IA conjugate with illumination area IAR via projection optical system PL, Then, by relatively moving reticle R in the scanning direction (the Y-axis direction) with respect to illumination area IAR (illumination light IL) and also relatively moving wafer W in the scanning direction (the Y-axis direction) with respect to exposure area IA (illumination light IL) in accordance with synchronous movement of reticle stage RST and wafer stage WST, scanning exposure of a shot, area (divided area) on wafer W is performed, and the pattern of reticle R is transferred onto the shot area.

Stage device 50, as is shown in FIG. 1, is equipped with wafer stage WST placed on a base board 12, an interferometer system 118 (refer to FIG. 5) for measuring position information of wafer stage WST, a stage drive system 124 (refer to FIG. 5) for moving wafer stage WST, and the like.

Wafer stage WST is supported above base board 12 via a clearance (void space, gap) of about several μm, by a non-contact bearing such as an air bearing. Wafer stage WST can also be moved in predetermined strokes in the X-axis direction and the Y-axis direction by a drive system including a linear motor or a planar motor, as well as be finely moved in the θz direction.

Figure 5:
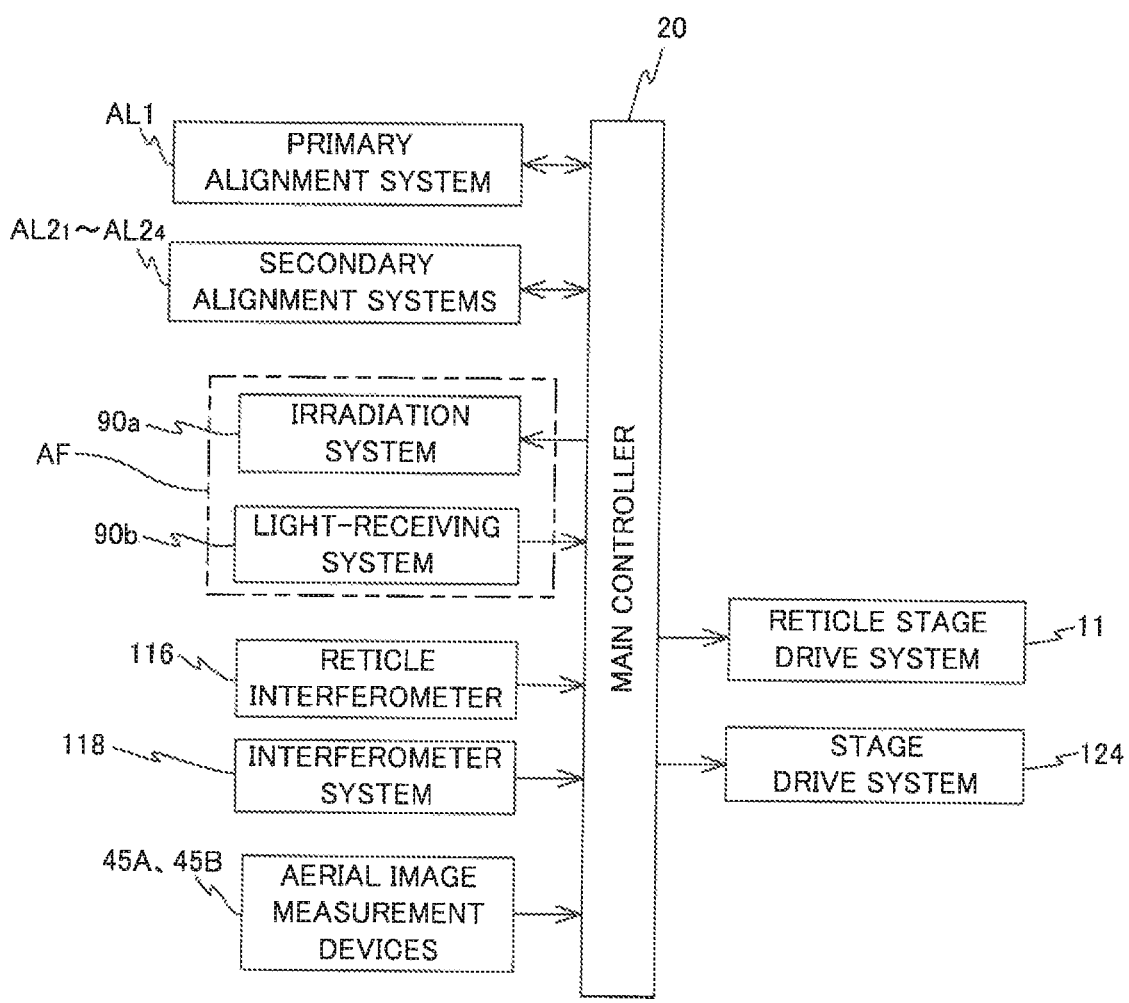
FIG. 5 is a block diagram showing an input-output relation of a main controller which mainly structures a control system of the exposure apparatus according to the embodiment.

Wafer stage WST includes a stage main section 91 and a wafer table WTB mounted on stage main section 91. Wafer table WTB can be finely moved in the Z-axis direction, the θx direction, and the θy direction on stage main section 91 via a Z-leveling mechanism (including a voice coil motor and the like). FIG. 5 shows a stage drive system including the drive system for moving wafer stage WST and Z-leveling mechanism, indicated as a stage drive system 124. Wafer table WTB can be moved, in directions of six degrees of freedom (in each of the X-axis, the Y-axis, the Z-axis, the θx, the θy, and the θz directions) by stage drive system 124, with respect to base board 12. Note that wafer stage WST can be structured movable in directions of six degrees of freedom, for example, using a planar motor of a magnetic levitation type or the like.

Figure 2:
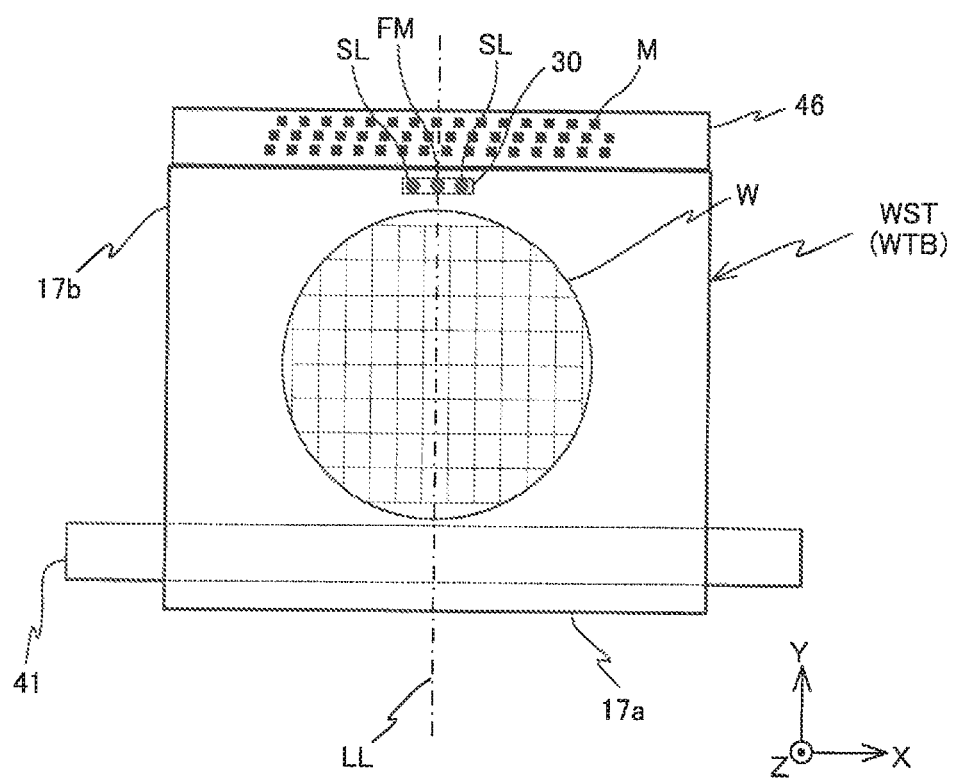
FIG. 2 is a planar view showing a wafer stage.

In the center on the upper surface of wafer table WTB, a wafer holder (not shown) is provided that holds wafer W by vacuum suction or the like. As is shown in FIG. 2, at the +Y side of the wafer holder (wafer W) on the upper surface of wafer table WTB, a measurement plate 30 is provided. This measurement plate 30 has a reference mark FM provided in the center and a pair of aerial image measurement slit plates SL provided on both sides in the X-axis direction of reference mark FM. Each aerial image measurement slit plate SL has a line-shaped opening pattern (X slit) of a predetermined width (e.g. 0.2 μm) whose longitudinal direction is in the Y-axis direction and a line-shaped, opening pattern (Y slit) of a predetermined width (e.g. 0.2 μm) whose longitudinal direction is in the X-axis direction formed, although they are omitted in the drawings.

And corresponding to each aerial image measurement slit plate SL, an optical system including a lens and the like and a light receiving element such as a photomultiplier (photomultiplier tube (PMT)) are placed inside wafer table WTB, and the pair of aerial image measurement slit plates SL and the corresponding optical systems and light receiving-elements structure a pair of aerial image measurement devices 45A and 45B (refer to FIG. 5) similar to the one disclosed in, for example, U.S. Patent Application Publication No. 2002/0041377 and the like. A predetermined signal processing is applied to measurement results (output signals of the light receiving elements) of aerial image measurement devices 45A and 45B by a signal processor (not shown), and the results are sent to main controller 20 (refer to FIG. 5).

At a −Y edge surface and a −X edge surface, of wafer table WTB, as is shown in FIG. 2, a reflection surface 17*a* and a reflection surface 17*b* that are used in interferometer system 118 are formed.

Also to a surface on the +Y side of wafer table WTB, as is shown in FIG. 2, a fiducial bar (hereinafter shortly referred to as an "FD bar") 46 similar to a CD bar disclosed in U.S. Pat. No. 8,054,472 is attached, extending in the X-axis direction. On an upper surface of FD bar 46, a plurality of fiducial marks M is formed. As each fiducial mark M, a two-dimensional mark is used having a size that can be detected by an alignment system to be described later on. Note that code LL shows a center line in the X-axis direction of wafer table WTB.

Figure 4:
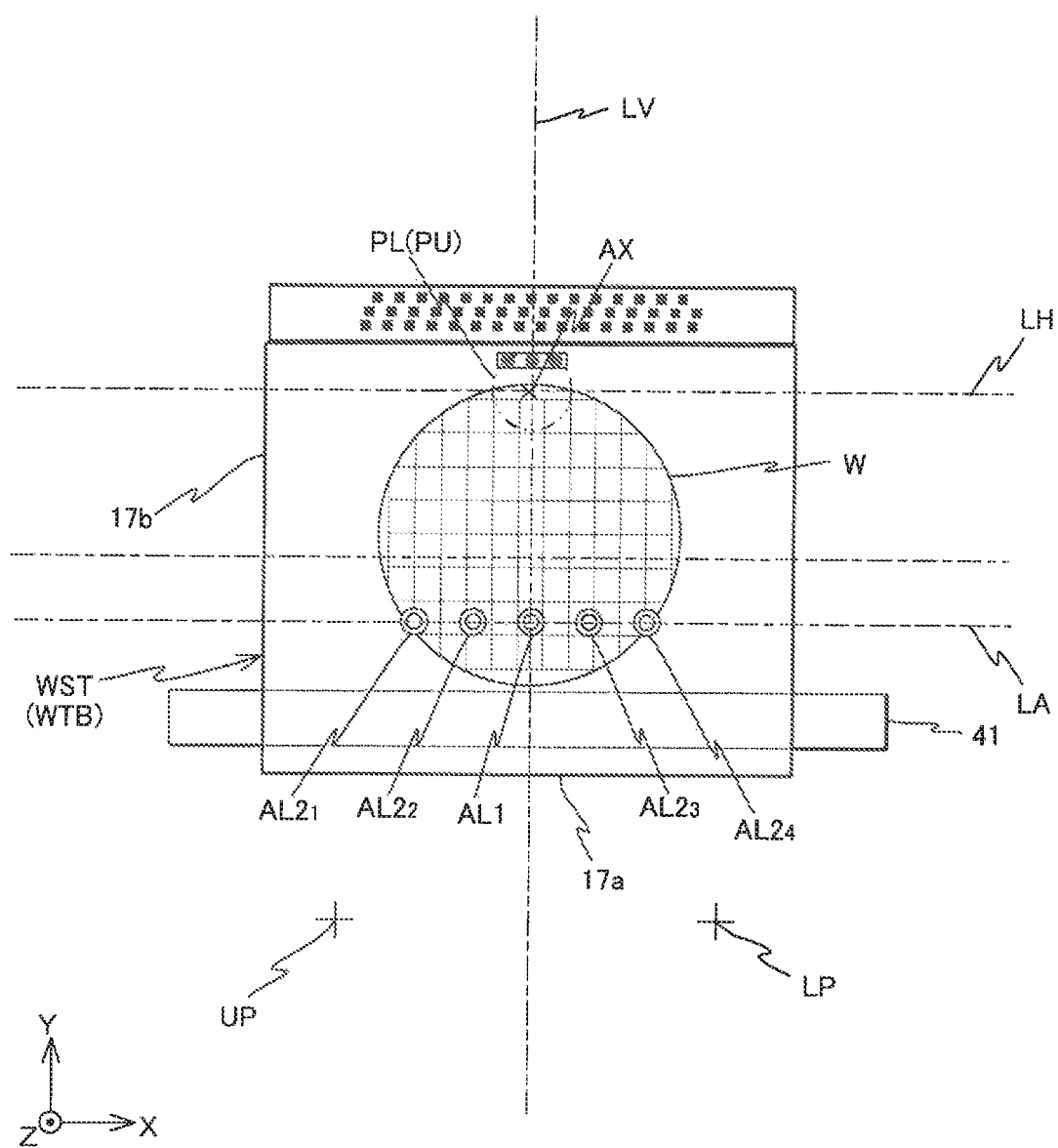
FIG. 4 is a planar view showing five alignment systems equipped in the exposure apparatus in FIG. 1 along with the wafer stage.

In exposure apparatus 100, as is shown in FIG. 4, a primary alignment system AL1 is placed whose detection center is at a position a predetermined distance away to the −Y side from optical axis AX on a straight line (hereinafter called a reference axis) LV parallel to the Y-axis that passes through optical axis AX of projection optical system PL. As is shown in FIG. 4, on one side and the other side in the X-axis direction with primary alignment system AL1 in between, secondary alignment systems $AL2_1$, $AL2_2$ and $AL2_3$, $AL2_4$ are provided whose detection centers are placed approximately symmetrical with respect to reference axis LV. Primary alignment system AL1 and secondary alignment systems $AL2_1$ to $AL2_4$ are fixed to a lower surface of a mainframe (not shown). In the description below, the primary alignment system, and the secondary-alignment systems will be shortly referred to as an alignment system as appropriate. The detection center can also be referred to as a detection position.

As each alignment system AL1 and $AL2_1$ to $AL2_4$, for example, an FIA (Field Image Alignment) system of an image processing method is used. Imaging signals from each alignment system AL1 and $AL2_1$ to $AL2_4$ are sent to main controller 20 via a signal processing system not shown (refer to FIG. 5).

Figure 3:
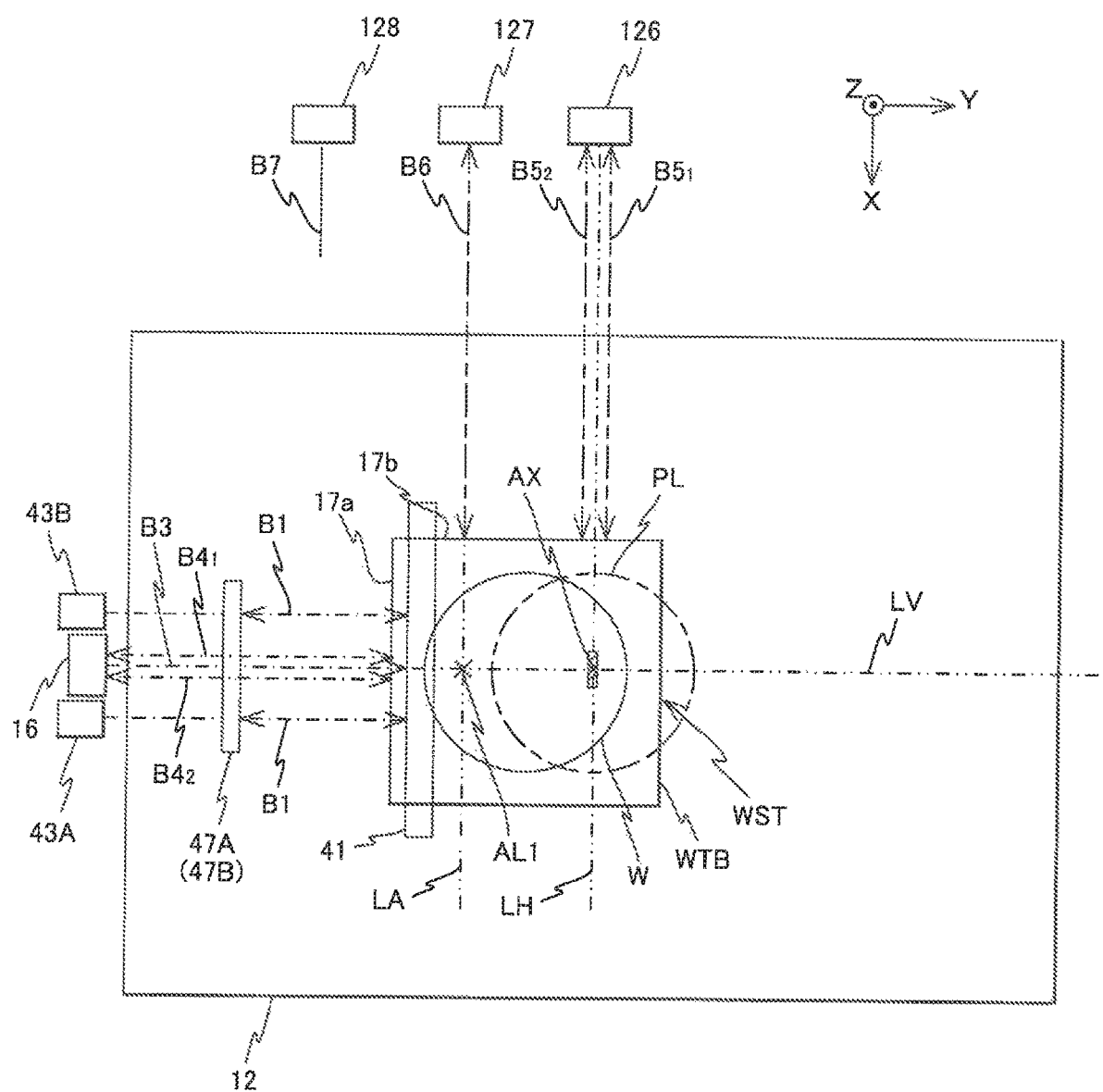

Interferometer system 118, as is shown in FIG. 3, is equipped with a Y interferometer 16 and three X interferometers 126 to 128 that each irradiates reflection surfaces 17*a* or 17*b* with an interferometer beam (measurement beam), receives a reflection light from reflection surface 17*a* or 17*b*, and measures position of wafer stage WST within the XY plane. Y interferometer 16 irradiates reflection surface 17*a* and a movable mirror 41 to be described later on with at least three measurement beams parallel to the Y-axis, including a pair of measurement beams $B4_1$ and $B4_2$ symmetrical with respect to reference axis LV. Also, X interferometer 126, as is shown in FIG. 3, irradiates reflection surface 17*b* with at least three measurement beams parallel to the X-axis, including a pair of measurement beams $B5_1$ and $B5_2$ symmetrical with respect to a straight line (hereinafter called a reference axis) LH which is orthogonal to optical axis AX and to reference axis LV and is parallel to the X-axis reference axis LV. Also, X interferometer 127 irradiates reflection surface 17*b* with at least two measurement beams parallel to the X-axis, including a measurement beam B6 whose measurement axis is a straight line (hereinafter called a reference axis) LA which is orthogonal to reference axis LV at the detection center of primary alignment system AL1 and is parallel to the X-axis. Also, X interferometer 128 irradiates reflection surface 17*b* with a measurement beam B7 parallel to the X-axis.

Position information from each interferometer described above of interferometer system 118 is supplied to main controller 20. Main controller 20, in addition to X, Y positions of wafer table WTB (wafer stage WST), can also calculate rotation in the θx direction (namely, pitching), rotation in the θy direction (namely, rolling), and rotation in the θz direction (namely, yawing) of wafer table WTB, based on measurement results of Y interferometer 16 and X interferometer 126 or 127.

Also, as is shown in FIG. 1, movable mirror 41 that has a concave-shaped reflection surface is attached to a side surface at the −Y side of stage main section 91. Movable mirror 41 is designed, as it can be seen from FIG. 2, so that the length in the X-axis direction is longer than reflection surface 17*a* of wafer table WTB.

Interferometer system 118 (refer to FIG. 5) is equipped, furthermore, with a pair of 2 interferometers 43A and 43B that is arranged facing movable mirror 41 (refer to FIGS. 1 and 3). Z interferometers 43A and 43B each irradiates movable mirror 41 with two measurement beams B1 and B2 parallel to the Y-axis, and for example, irradiates fixed mirrors 47A and 47B fixed to a frame (not shown) supported by projection unit PU with each of the measurement beams B1 and B2 via movable mirror 41. And then, by receiving each of the reflection lights, Z interferometers 43A and 43B each measures an optical path length of measurement beams B1 and B2. By the measurement results, main controller 20 calculates the position of wafer stage WST in directions of four degrees of freedom (Y, Z, θy, θz).

Note that instead of interferometer system 118, or along with interferometer system 118, an encoder system can be used to measure all position information of wafer stage WST (wafer table WTB). Note that in FIG. 4, code UP indicates an unloading position where unloading of the wafer on wafer stage WST is performed, and code LP indicates a loading position where a new wafer is loaded onto wafer stage WST.

Other than this, in exposure apparatus 100 of the embodiment, near projection unit PU, a multi-point focal point detection system (hereinafter shortly referred to as "multi-point AF system") AF is provided (refer to FIG. 5), consisting of an irradiation system 90*a* and a light-receiving system 90*b* that are used to detect 2 position of the surface of wafer W at multiple detection points. As multi-point AF system AF, a multi-point AF system of an oblique incidence method with a structure similar to the one disclosed in, for example, U.S. Pat. No. 5,448,332 and the like is employed. Note that irradiation system 90*a* and light-receiving system 90*b* of multi-point AF system AF can be arranged near alignment systems AL1 and $AL2_1$ to $AL2_4$ as is disclosed in, for example, U.S. Pat. No. 8,054,472 and the like, and position information (surface position information) in the Z-axis direction of almost the entire surface of wafer W may be measured (focus mapping may be performed) by scanning wafer W once in the Y-axis direction at the time of wafer alignment. In this case, a surface position measurement system is preferably provided that measures the S position of wafer table WTB during this focus mapping.

FIG. 5 is a block diagram showing an output relation of main controller 20 which mainly structures the control system of exposure apparatus 100. Main controller 20 consists of a microcomputer (or a workstation) and has overall control over the whole exposure apparatus 100.

In exposure apparatus 100 structured in the manner described above, a series of processing using wafer stage WST is performed by main controller 20, according to a procedure similar to the one disclosed in, for example, U.S. Pat. No. 8,054,472 (however, processing related to the encoder system is not included since exposure apparatus 100 is not equipped with an encoder system), such as unloading wafer W at unloading position UP (refer to FIG. 4), loading a new wafer W onto wafer table WTB at loading position LP (refer to FIG. 4), first-half processing of base line check of primary alignment system AL1 using reference mark FM of measurement plate 30 and primary alignment system AL1, re-setting (reset) of origin of interferometer system, alignment measurement of wafer W using alignment systems AL1 and $AL2_1$ to $AL2_4$, second-half processing of base line check of primary alignment system AL1 using aerial image measurement devices 45A and 45B, exposure of a plurality of shot areas on wafer W by a step-and-scan method based on position information of each shot area on wafer W obtained by results of alignment measurement and the latest base line of the alignment system, and the like.

Figure 6:
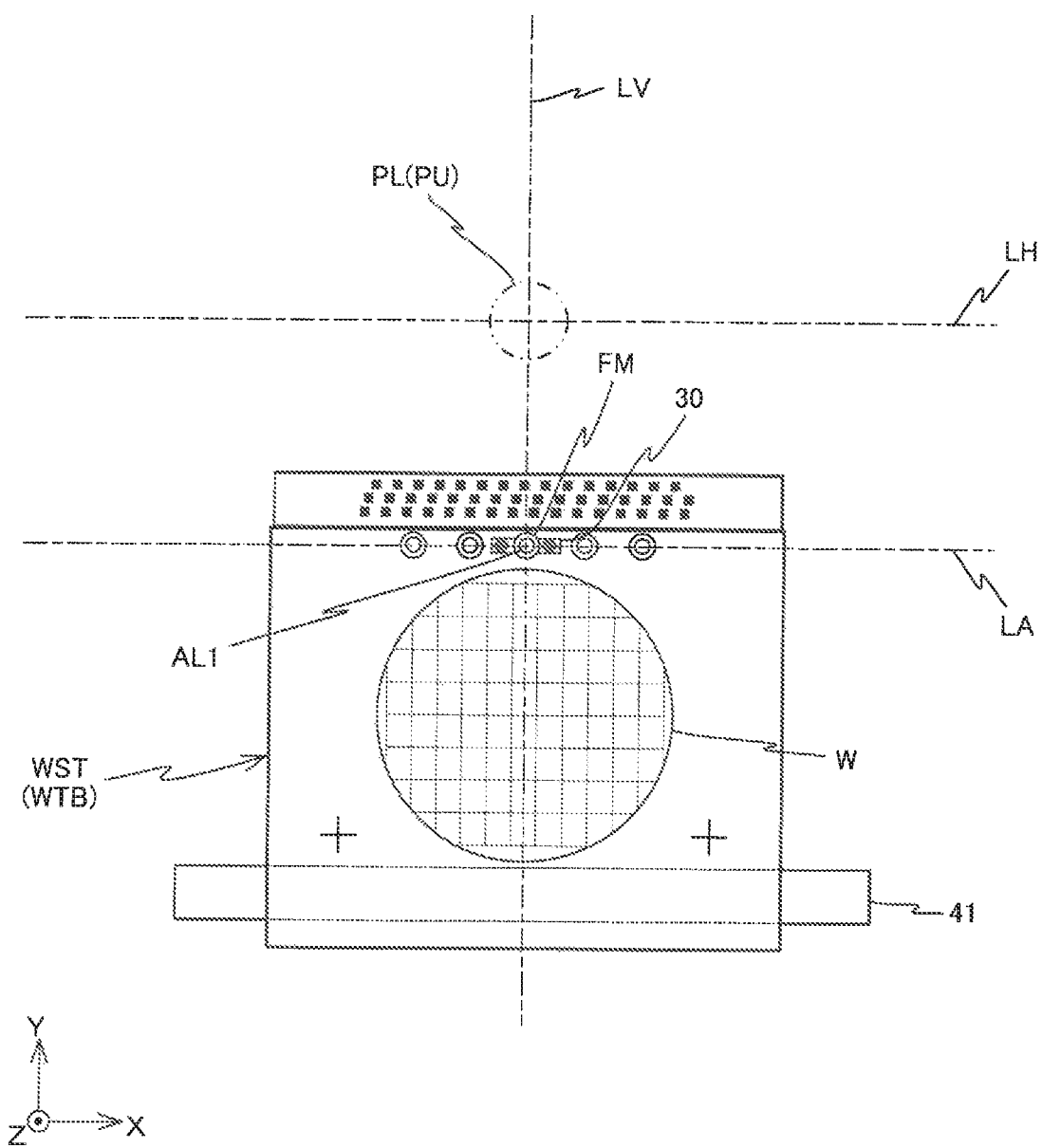
FIG. 6 is a view showing a state where a first-half processing of Pri-BCHK is performed.

Here, alignment measurement (and base line check of alignment system) of wafer w using alignment systems AL1 and $AL2_1$ to $AL2_4$ will be described. After loading wafer W, main controller 20 moves wafer stage WST to a position where reference mark FM on measurement plate 30 is positioned within a detection field of primary alignment system AL1 (that is, a position where the first-half processing of base line measurement (Pri-BCHK) of the primary alignment system is performed), as is shown in FIG. 6. On this operation, main controller 20 moves (control the position of) wafer stage WST while measuring position information of wafer table WTB (wafer stage WST) within the XY plane, using Y interferometer 16 and X interferometer 127 of interferometer system 118. Then, main controller 20 performs the first-half processing of Pri-BCHK of detecting reference mark FM using primary alignment system AL1.

Figure 7:
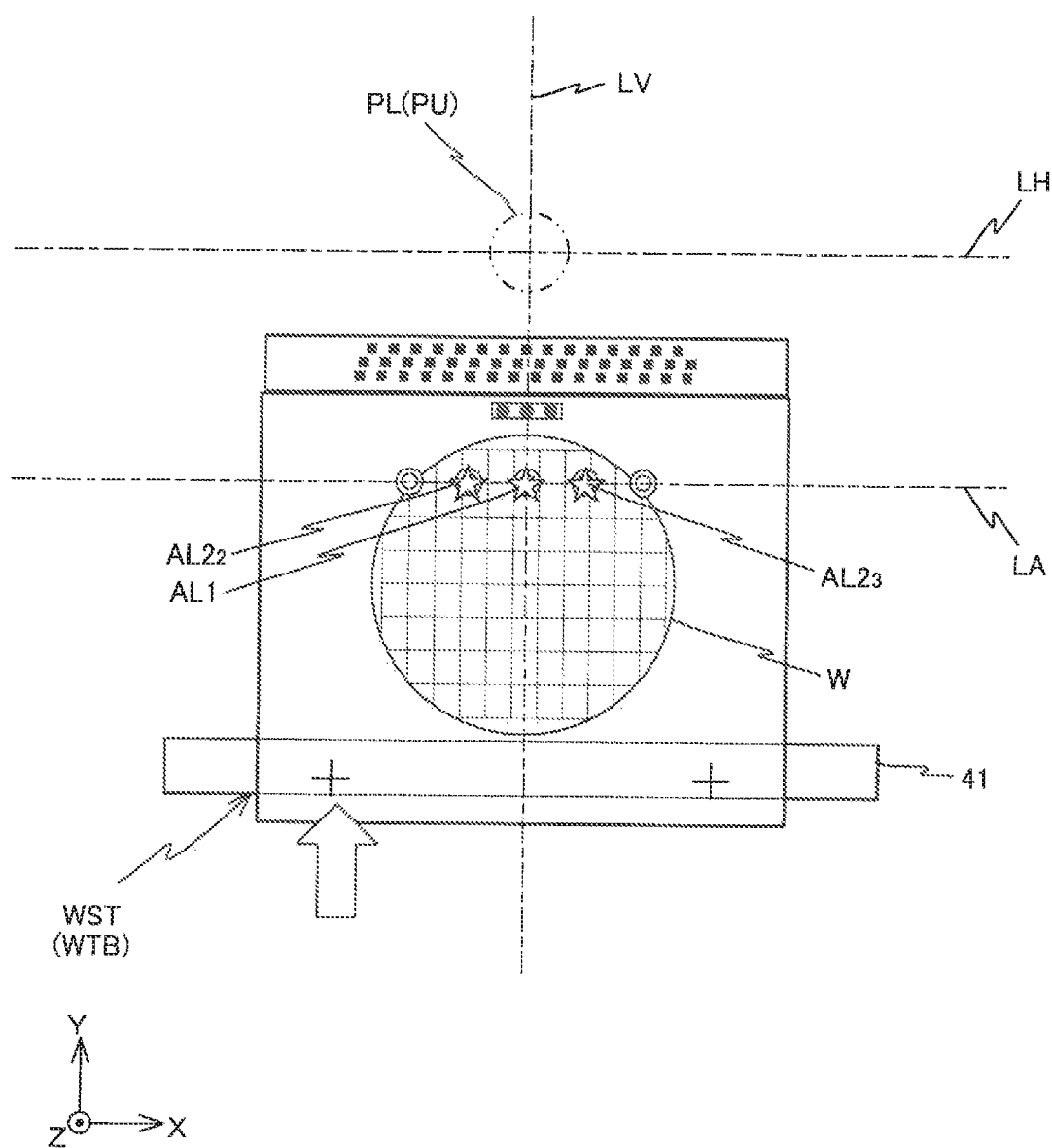
FIG. 7 is a view used to explain detection of three alignment marks arranged in three first alignment shot areas using alignment systems AL1, $AL2_2$ and $AL2_3$.

Next, as is shown in FIG. 7, main controller 20 moves wafer stage WST in a direction indicated by the outlined arrow (+Y direction). Then, main controller 20 detects alignment marks arranged in three first alignment shot areas using three alignment systems AL1, $AL2_2$, and $AL2_3$ as is indicated by star marks in FIG. 7. Detection of alignment marks arranged in the three first alignment shot areas by main controller 20 is actually performed in the following manner.

Figure 8A:
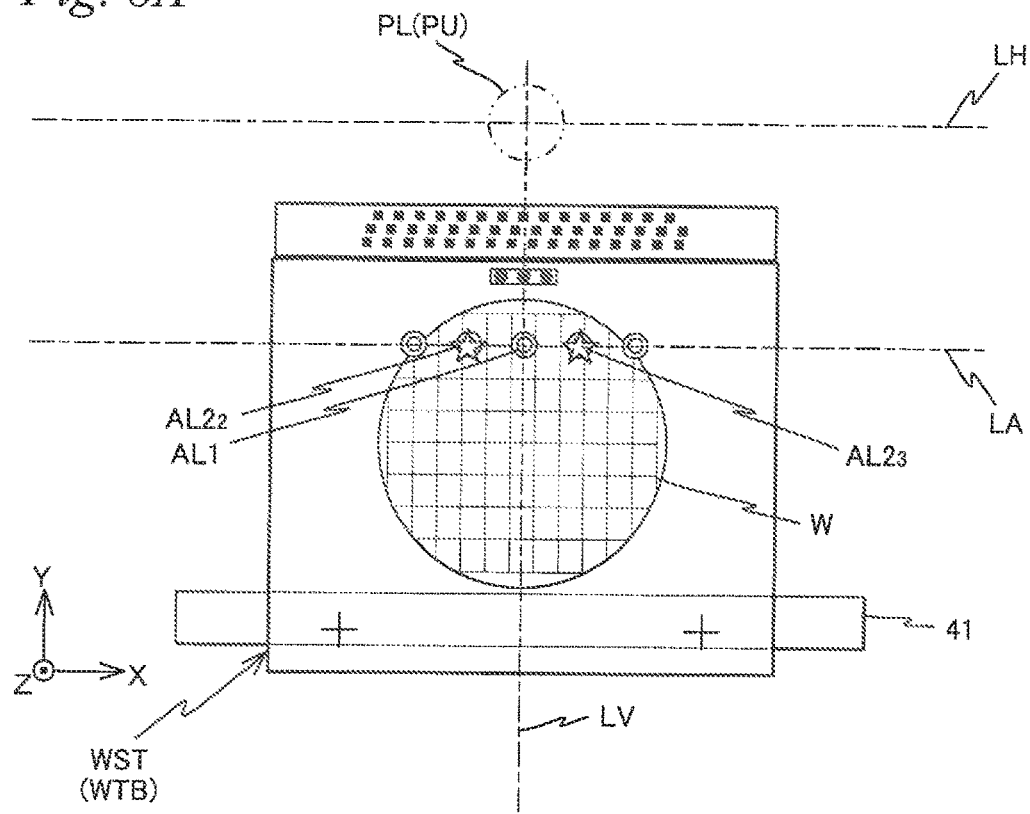
FIGS. 8A and 8B are views (No. 1, No. 2) used to explain specific detection procedures of each of the three alignment, marks in FIG. 7.

First of all, main controller 20 individually detects an alignment mark that is present in each detection field concurrently using alignment systems $AL2_2$ and $AL2_3$, as is shown in FIG. 8A. On this operation, main controller 20 executes parallel detection of alignment marks using alignment systems $AL2_2$ and $AL2_3$ in a state controlling an auto-focus mechanism that each alignment system $AL2_2$ and $AL2_3$ has, so that the alignment marks subject to detection coincide (the surface of wafer W coincides) with the focus of the optical system that each alignment system $AL2_2$ and $AL2_3$ has.

Figure 8B:
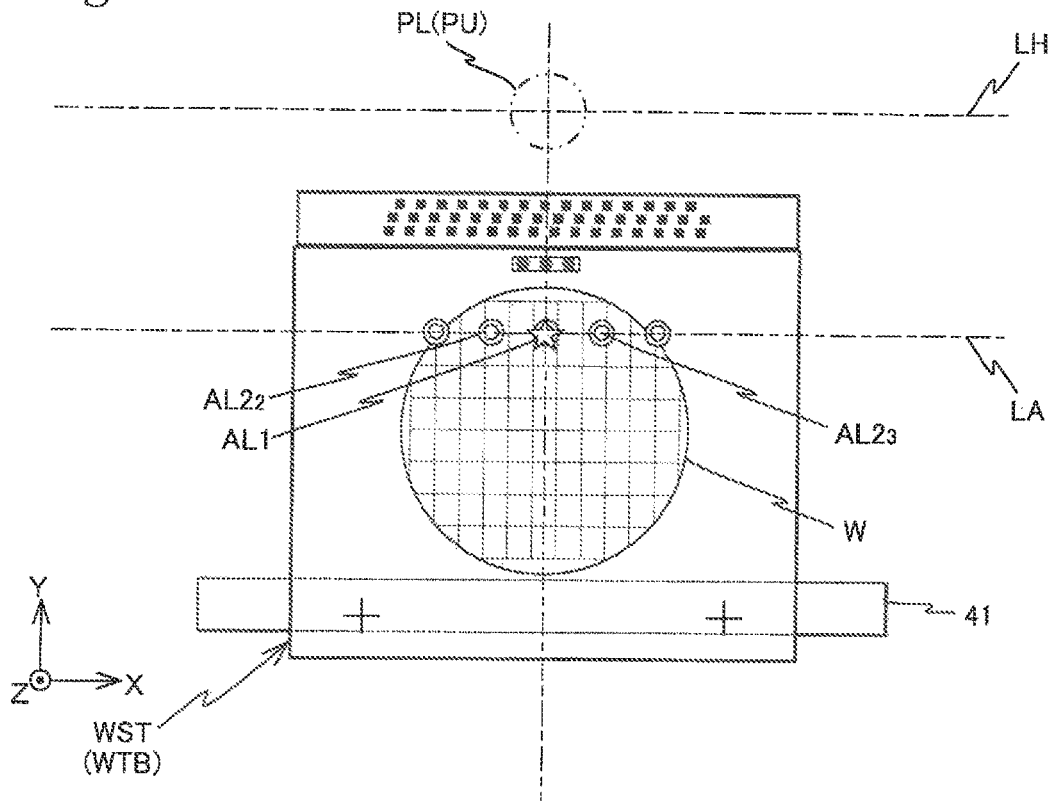

Next, as is shown in FIG. 8B, main controller 20 detects an alignment mark present in the detection field using alignment system AL1. On this operation as well, main controller 20 executes detection of the alignment mark in a state controlling an auto-focus mechanism that alignment system AL1 has, so that the alignment mark, subject to detection coincide (the surface of wafer W coincides) with the focus of the optical system, that alignment system AL1 has.

Note that instead of controlling the auto-focus mechanism of each alignment system described above, focus-leveling control (control of Z position and position in the θx and the θy directions) or focus control (control of Z position) of wafer W may be performed so that the alignment mark subject to detection coincides with the focus of the optical system that each alignment system has.

Then, main controller 20 associates detection results by the three alignment systems AL1, $AL2_2$ and $AL2_3$ with position information (namely, X, Y, and θz positions of wafer table WTB) of Y interferometer 16 and X interferometer 127 of interferometer system 118 at the time of each detection, and stores the results in an internal memory.

Figure 9:
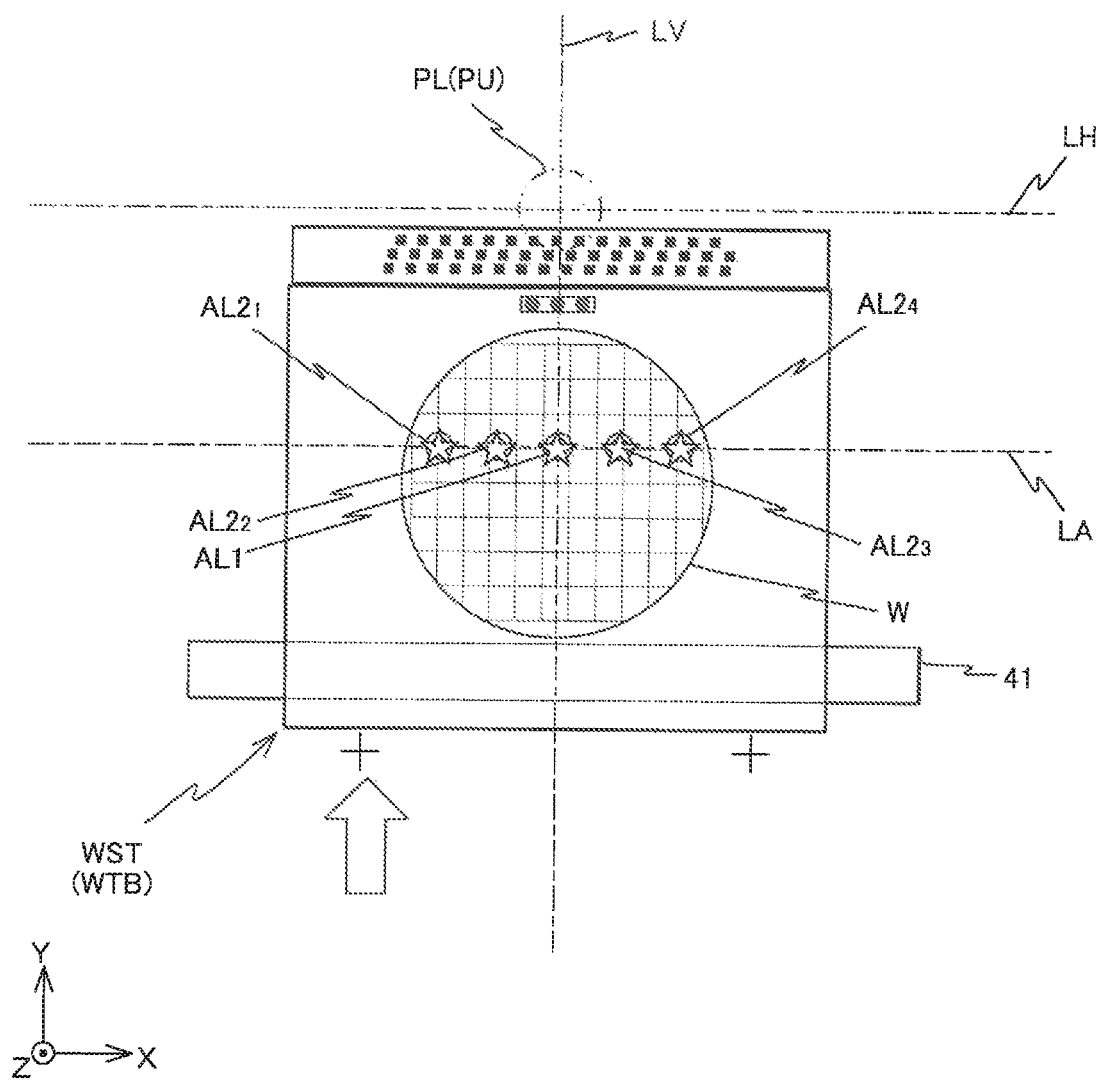
FIG. 9 is a view used to explain detection of five alignment marks arranged in five second alignment shot areas using alignment systems AL1, $AL2_1$ and $AL2_4$.

When detection of the alignment marks arranged in the three first alignment shot areas described above is completed, main controller 20 moves wafer stage WST in a direction indicated by the outlined arrow (+Y direction) as is shown in FIG. 9. Then, main controller 20 detects the alignment marks arranged in five second alignment shot areas using five alignment systems AL1 and $AL2_1$ to $AL2_4$ as is indicated by the star marks in FIG. 9. Detection of alignment marks arranged in the five second alignment shot areas by main controller 20 is actually performed in the following manner.

Figure 10A:
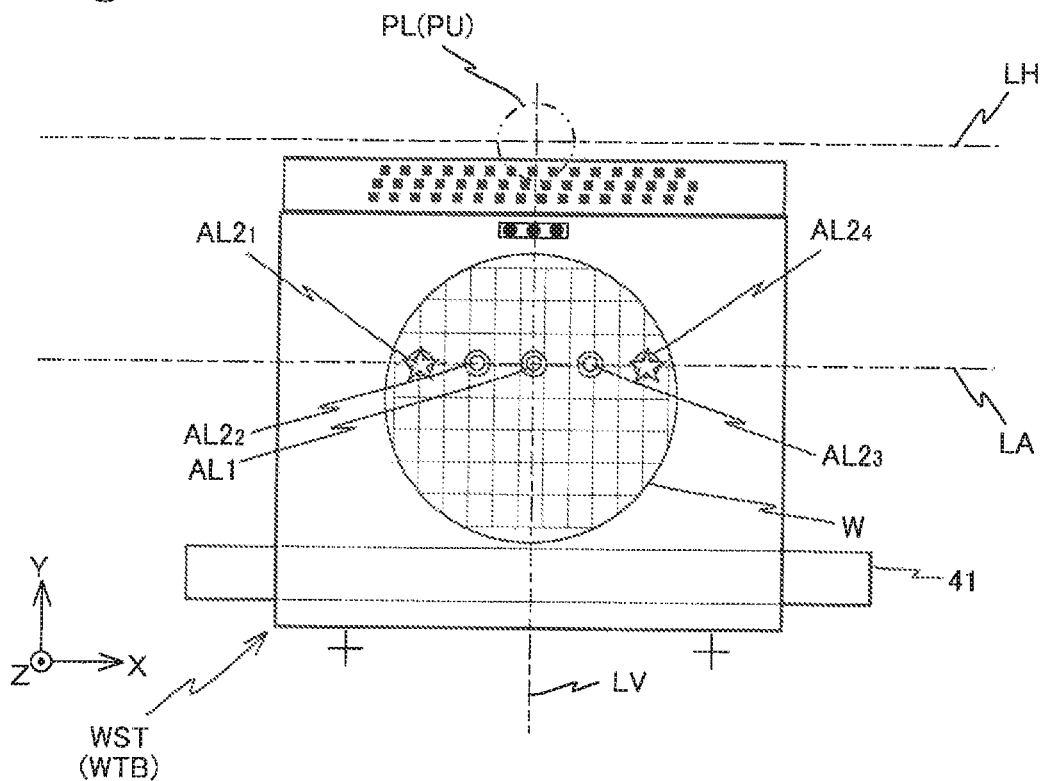
FIGS. 10A and 10B are views (No. 1, No. 2) used to explain specific detection procedures of each of the five alignment marks in FIG. 9.

First of all, main controller 20 individually detects an alignment mark that is present in each detection field concurrently using alignment systems $AL2_1$ and $AL2_4$, as is shown in FIG. 10A. On this operation, main controller 20 executes parallel detection of alignment marks using alignment systems $AL2_1$ and $AL2_4$ in a state controlling an auto-focus mechanism that each alignment system $AL2_1$ and $AL2_4$ has (or in a state where focus-leveling control of wafer W has been performed), so that the alignment marks subject to detection coincide (the surface of wafer W coincides) with the focus of the optical system that each alignment system $AL2_1$ and $AL2_4$ has.

Figure 10B:
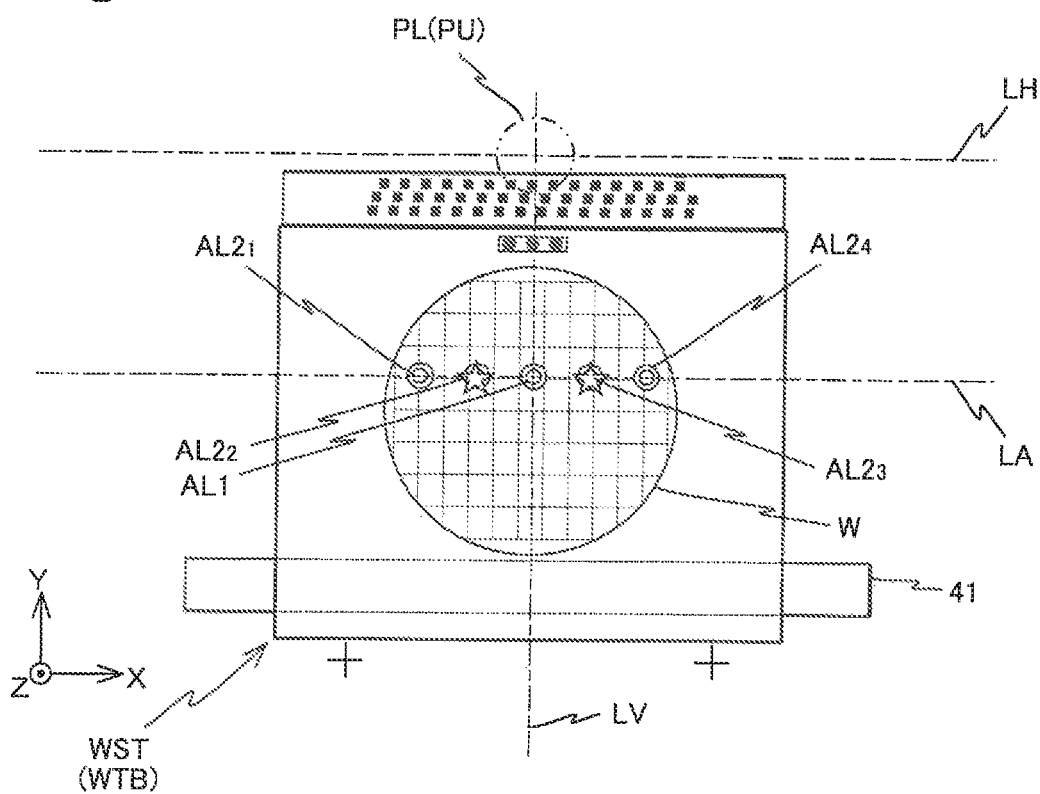

Next, main controller 20 individually detects an alignment mark that is present in each detection field concurrently using alignment systems $AL2_2$ and $AL2_3$, as is shown in FIG. 10B. On this operation, main controller 20 executes parallel detection of alignment marks using alignment systems $AL2_2$ and $AL2_3$ in a state controlling an auto-focus mechanism that each alignment system $AL2_2$ and $AL2_3$ has (or in a state where focus-leveling control of wafer W has been performed), so that the alignment marks subject to detection coincide (the surface of wafer W coincides) with the focus of the optical system that each alignment system $AL2_2$ and $AL2_3$ has.

Figure 11:
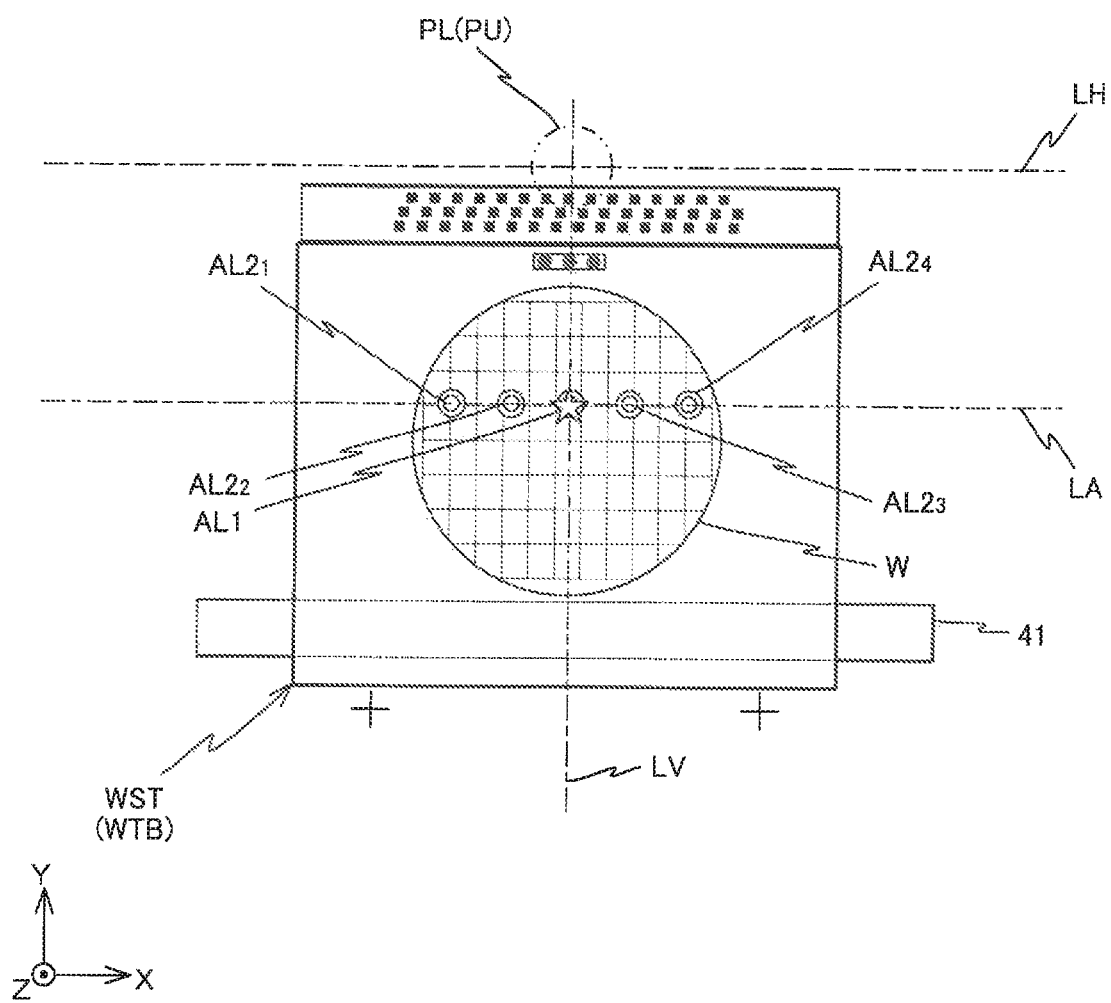
FIG. 11 is a view (No. 3) used to explain specific detection procedures of the five alignment marks in FIG. 9.

Next, as is shown in FIG. 11, main controller 20 detects an alignment mark present in the detection field, using alignment system AL1. On this operation as well, main controller 20 executes detection of the alignment mark in a state controlling an auto-focus mechanism that alignment system AL1 has (or in a state where focus-leveling control of wafer W has been performed), so that the alignment mark subject to detection coincide (the surface of wafer W coincides) with the focus of the optical system that alignment system AL1 has.

Then, main controller 20 associates detection results by the five alignment systems AL1 and $AL2_1$ to $AL2_4$ with position information (namely, X, Y, and θz positions of wafer table WTB) of Y interferometer 16 and X interferometer 127 of interferometer system 118 at the time of each detection, and stores the results in the internal memory.

Figure 12:
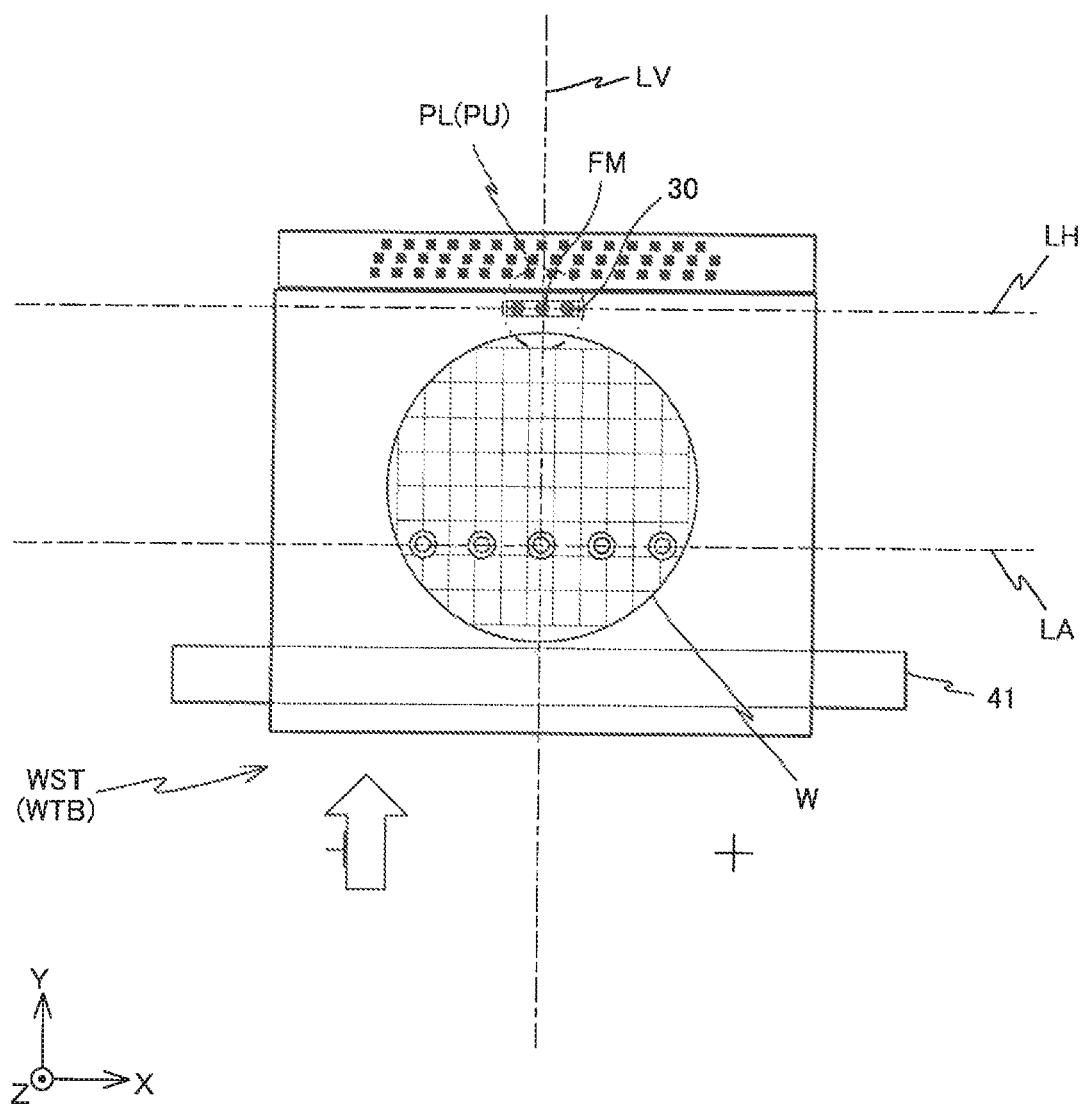
FIG. 12 is a view showing a state where a second-half processing of Pri-BCHK is performed.

When detection of the alignment marks arranged in the five second, alignment shot areas described above is completed, main controller 20 moves wafer stage WST in the +Y direction (the direction, indicated by the outlined arrow in FIG. 12). Then, as is shown in FIG. 12, when wafer stage WST reaches a position where measurement plate 30 is positioned directly below projection optical system PL, main controller 20 makes wafer stage WST stop at the position, and then executes a second-half processing of Pri-BCHK. Here, the second-half processing of Pri-BCHK refers to a processing in which projection images (aerial images) of a pair of measurement marks on reticle R projected by projection optical system PL are each measured using aerial image measurement devices 45A and 45B including measurement plate 30 previously described, by an aerial image measurement operation of a slit-scan method that uses each of the pair of aerial image measurement slit plates SL similar to the one described, in, for example, U.S. Patent Application Publication No. 2002/0041377. Then, in the processing, the measurement results (aerial image intensity according to X, Y positions of wafer table WTB) are stored in the internal memory. Main controller 20 calculates the base line of primary alignment system AL1, based on results of the first-half processing of Pri-BCHK and the second-half processing of Pri-BCHK.

Main controller 20, furthermore, moves wafer stage WST in the +Y direction, and sequentially executes detection of five alignment marks arranged in a third alignment shot area and three alignment marks arranged in a fourth alignment shot area, and then associates each detection result with position information (namely, X, Y, and θ2 positions of wafer table WTB) of Y interferometer 16 and X interferometer 127 of interferometer system 118 at the time of each detection and stores the results in the internal memory. Here, detection of the five alignment marks arranged in the third alignment shot area is performed in a procedure similar to the detection of the five alignment marks arranged in the second alignment shot area previously described, and detection of the three alignment marks arranged in the fourth alignment shot area, is performed in a procedure similar to the detection of the three alignment marks arranged in the first alignment shot area previously described.

Main controller 20 uses the detection results (two-dimensional position information) of the total of 16 alignment marks obtained in the manner described above and the position information (namely, X, Y, and θz positions of wafer table WTB) of the corresponding Y interferometer 16 and X interferometer 127 of interferometer system 118, and by performing statistical calculation disclosed in, for example, U.S. Pat. No. 4,780,617 and the like, the main controller calculates the arrangement and scaling (shot magnification) for all shot areas on wafer W on a coordinate system (an XY coordinate system whose origin is the center of wafer table WTB) set by the measurement axes of interferometer system 118. Furthermore, based on the shot magnification which has been calculated, main controller 20 adjusts optical properties such as projection magnification of projection optical system PL by controlling an adjustment device (not shown) that adjusts the optical properties of projection optical system PL, such as by driving specific movable lenses that structure projection optical system PL or by changing pressure of gas inside an air tight chamber formed between specific lenses that structure projection optical system PL or the like.

Then, main controller 20 performs exposure by the step-and-scan method based on results of the wafer alignment (EGA) previously described performed in advance and the latest base line of alignment systems AL1 and $AL2_1$ to $AL2_4$, and sequentially transfers the reticle pattern onto the plurality of shot areas on wafer W. Hereinafter, a similar operation is repeatedly performed.

Note that base line measurement of the secondary alignment systems $AL2_1$ to $AL2_4$ is performed by simultaneously measuring fiducial marks M on FD bar 46 in each field using alignment, systems AL1 and $AL2_1$ to $AL2_4$ at an appropriate timing similarly to the method, disclosed in, for example, U.S. Pat. No. 8,054,472, based on the measurement values of at least one of the pair of Z interferometers 43A, 43B Y and Y interferometer 16 in a state where θz rotation of FD bar 46 (wafer stage WST) has been adjusted.

Here, an example of a layout of alignment marks on wafer W suitable for the alignment measurement previously described in which wafer stage WST is moved only in the Y-axis direction will be described.

Figure 13A:
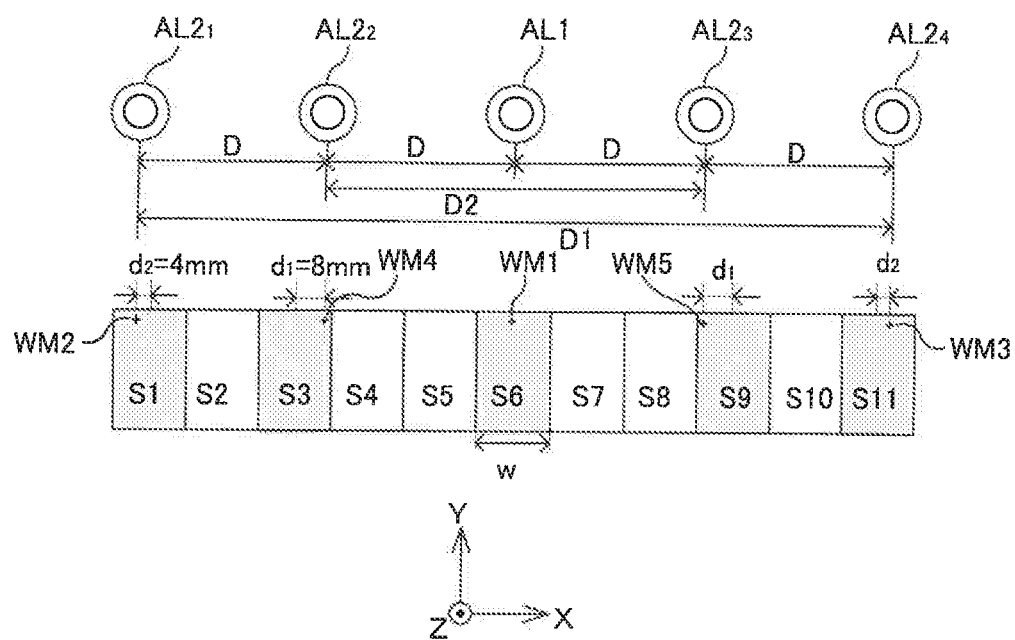
FIGS. 13A and 13B are views used to explain an example of a layout of alignment marks on a wafer suitable for alignment measurement performed by moving the wafer only in the Y-axis direction.

FIG. 13A shows a row of 11 shot areas which are extracted, including the five second alignment shot areas on wafer W, along with the five alignment systems AL1 and $AL2_1$ to $AL2_4$. For convenience of explanation, numbers S1 to S11 are given to each of the shot areas. Here, five shot areas S1, S3, S6, S9, and S11 are to be the second alignment shot areas.

In shot area S6, an alignment mark (hereinafter appropriately be shortened to mark) WM1 is formed at the center in the X-axis direction which is a cross-scan direction (also called a stepping direction) orthogonal to the scanning direction, and in the description below, a state where wafer W is positioned so that this mark WM1 coincides with the detection center (center of detection area) of alignment system AL1 will be referred to as a reference state of wafer W. Note that although the alignment marks are arranged on scribe lines, here, for convenience of explanation, the alignment marks are shown to be arranged within the shot area.

Width in the X-axis direction of the shot area is to be described as w, and distance (spacing) between detection centers of mutually adjacent alignment systems ($AL2_1$, $AL2_2$), ($AL2_2$, $AL_1$), ($AL1$, $AL2_3$), ($AL2_3$, $AL_24$) are to be described as D. Here, as an example, the description will be made with the width, being w=20 mm, and the distance being D=52 mm. Note that in the description below, regarding the alignment system, instead of referring to spacing between detection centers, the expression "spacing" will simply be used as appropriate.

Note that spacing D between, detection centers may be a designed distance determined in advance, a distance measured using a measurement member (e.g., FD bar 46) provided at wafer table WTB, or a distance measured using a sensor provided at wafer table WTB.

When wafer W is in the reference state, in order to make mark detection, possible by alignment system $AL2_1$ whose detection center is at a position distanced by 2D=104 mm in the −X direction from the detection center of alignment system AL1, mark WM2 which is subject to detection by alignment system $AL2_1$ only has to be arranged at a position shifted by a distance $d_2$ (=4 mm) in the −X direction from the center in the X-axis direction within shot area S1, as is shown in FIG. 13A.

Similarly, when wafer W is in the reference state, in order to make mark detection possible by alignment system $AL2_4$ whose detection center is at a position distanced by 2D=104 mm in the +X direction from the detection center of alignment system AL1, mark WM3 which is subject to detection by alignment system $AL2_4$ only has to be arranged at a position shifted by distance $d_2$ (=4 mm) in the +X direction from the center in the X-axis direction within shot area S11.

Similarly, when wafer W is in the reference state, in order to make mark detection possible by alignment system $AL2_2$ whose detection center is at a position distanced, by D=52 mm in the −X direction from the detection center of alignment system. AL1, mark WM4 which is subject to detection by alignment system $AL2_2$ only has to be arranged, at a position shifted by a distance $d_1$ (=8 mm) in the +X direction from the center in the X-axis direction within shot area S3.

Similarly, when wafer W is in the reference state, in order to make mark detection possible by alignment system $AL2_3$ whose detection center is at a position distanced by D=52 mm in the +X direction, from the detection center of alignment system AL1, mark WM5 which is subject to detection by alignment system $AL2_3$ only has to be arranged at a position shifted by distance $d_1$ (=8 mm) in the −X direction from the center in the X-axis direction within shot area S9.

Figure 13B:
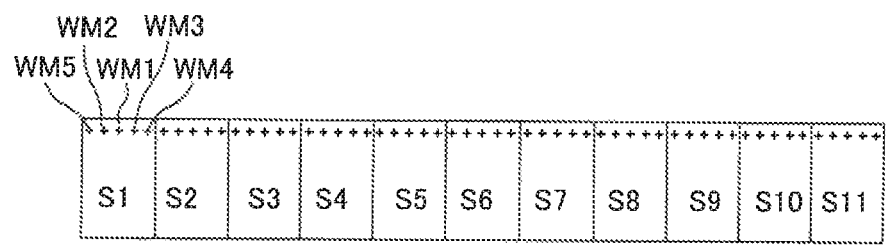

However, since marks WM1 to WM5 are actually formed on wafer W by exposure, marks WM1 to WM5 are all formed in each shot, area as is shown in FIG. 13B. Accordingly, if marks WM1 to WM5 are located at a total of five places in each shot area which are; a center position in the X-axis direction, a position shifted by $d_1$ to the −X side from the center position, a position shifted by $d_2$ to the −X side from the center position, a position shifted by $d_2$ to the +X side from the center position, and a position shifted, by $d_2$ to the +X side from the center position, then it is possible to detect the marks in the five second alignment shot areas by the five alignment systems AL1 and $AL2_1$ to $AL2_4$.

In the description of the embodiment described above, wafer stage WST was moved only in the Y-axis direction on the premise that marks WM1 to WM5 were located at five places within the shot areas and the alignment marks subject to detection were naturally to be positioned within the three or five detection fields of the five alignment systems AL1 and $AL2_1$ to $AL2_4$ at each position setting position, similar to the description here.

Figure 14A:
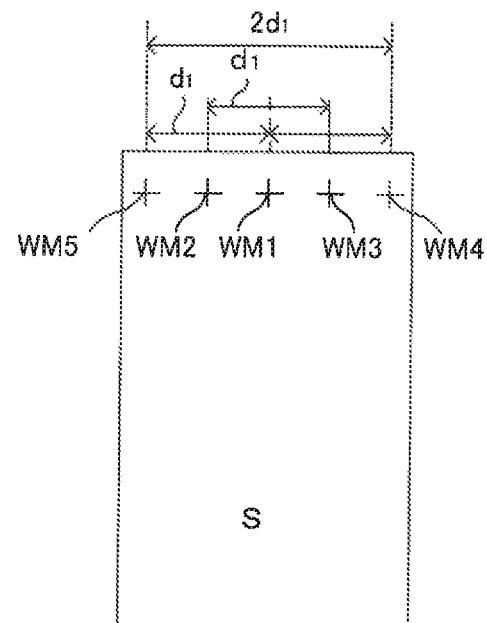
FIGS. 14A and 14B are views (No. 1, No. 2) used to explain an example of a layout of alignment marks on a wafer suitable for alignment measurement performed by moving the wafer in the Y-axis direction and the X-axis direction.

However, from another viewpoint, in parallel detection of the marks with alignment system $AL2_1$ and alignment system $AL2_4$ whose spacing in between is D1=4D (208 mm), mark WM2 within one shot area and mark WM3 within another shot area are detected. Mark WM2 and mark WM3, as is shown enlarged in FIG. 14A, are two marks that are formed apart by spacing $d_1$ (=8 mm) in the X-axis direction in each shot area S.

Also, in parallel detection of the marks with alignment system $AL2_2$ and alignment system $AL2_3$ whose spacing in between is D2=2D (104 mm), mark WM4 within one shot area and mark WM5 within another shot area are detected. Mark WM4 and mark WM5, as is shown enlarged in FIG. 14A, are two marks that are formed apart by spacing $2d_1$ (=16 mm) in the X-axis direction in each shot area S.

Figure 14B:
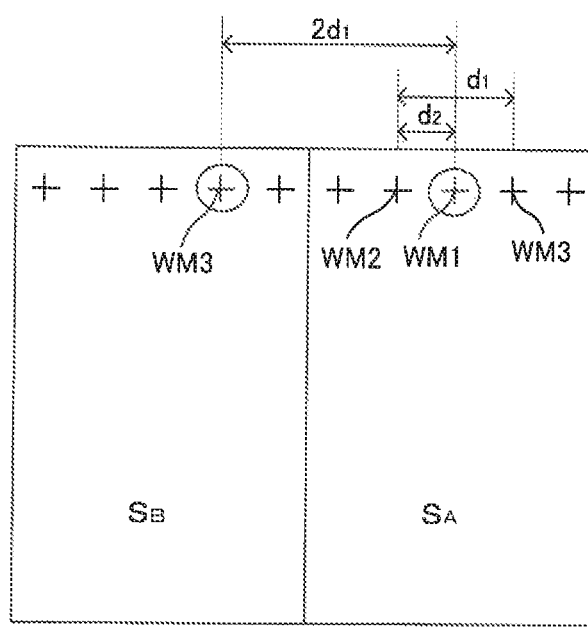

However, as is shown in FIG. 14B, of adjacent two shot areas (to be referred to as a shot area $S_A$ and a shot area $S_B$ for the sake of convenience), the spacing in the X-axis direction between mark WM1 surrounded in a circle within one shot area $S_A$ and mark WM3 within the ocher shot area $S_B$ is $2d_1$=16 mm. Although it is omitted in the drawings, the spacing between mark WM1 within shot area $S_A$ and mark WM2 within another shot area adjacent to shot area $S_A$ on a side opposite of shot area $S_B$ is also $2d_1$=16 mm.

Accordingly, it becomes possible to detect mark WM3 (or WM2) within any shot area and mark WM1 within another shot area concurrently using alignment system $AL2_2$ and alignment system $AL2_3$ by moving wafer W by a predetermined distance in the X-axis direction, without maintaining the reference state. That is, by moving wafer W not only in the Y-axis direction but also in the X-axis direction on detection, each shot area will only need to have marks WM1, WM2, and WM3 formed. In other words, only mark WM3 arranged apart by spacing $d_1$=8 mm in the X-axis direction with respect to mark WM2 and mark WM1 arranged apart by spacing $d_2$=4 mm in the X-axis direction with respect to mark WM2 have to be formed in each shot area.

Here, when considering a relation between spacing $d_1$, $d_2$, spacing D1=4D=208 mm between alignment systems $AL2_1$ and $AL2_4$ and spacing D2=2D=104 mm between alignment systems $AL2_2$ and $AL2_3$, and length w (=20 mm) in the X-axis direction of the shot area, it can be seen that the relations;

D1=10w+$d_1$, and D2=5w+$d_2$, are established.

From this, it can be seen that $d_1$ is a remainder when D1 is divided by w, and $d_2$ is a remainder when D2 is divided by w.

Now, in the alignment sequence described earlier, since alignment system AL1 detects one mark singly, any mark may be chosen as a detection, subject without any problems.

While the case has been described above where a total of three marks, mark WM2, and mark WM1 and WM3 arranged apart by spacing $d_1$ and $d_2$ in the X-axis direction with respect to mark WM2, respectively, are provided, the description is not limited to this, and two marks arranged apart by distance $d_1$ in the X-axis direction and two marks arranged apart by distance $d_2$ in the X-axis direction may be provided.

Figure 15:
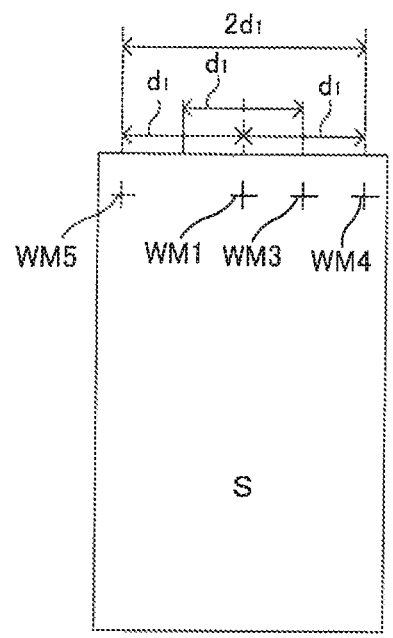
FIG. 15 is a view used to explain another example of a layout of alignment marks on a wafer suitable for alignment measurement performed by moving the wafer in the Y-axis direction and the X-axis direction.

For example, as is shown in FIG. 15, a total of four marks; two marks WM3 and WM4 arranged apart by $d_2$, and two marks WM5 and WM1 arranged apart by $d_1$, may be provided within each shot area S. In this case, in the parallel detection of the marks using alignment system $AL2_1$ and alignment system $AL2_4$ whose spacing in between is D1=4D=208 mm, mark WM5 (or WM4) within any one shot area and mark WM1 within another shot area can be detected, in the parallel detection of the marks using alignment system $AL2_2$ and alignment system $AL2_3$ whose spacing in between is D2=2D=104 mm, mark WM4 within any one shot area and mark WM5 within another shot area can be detected, and alignment system AL1 can detect any mark of any shot, such as for example, mark WM3.

As is obvious from the description so far, it can be seen that the example of providing only three marks, mark WM2, mark WW3, and mark WM1 within each shot area described earlier is a special case as is previously described using FIGS. 14A and 15, that is, the case when the number of marks within the shot areas is reduced as much as possible.

The description so far was made on the premise of performing detection of the marks using three sets of alignment systems described above which are ($AL2_1$, $AL2_4$), ($AL2_2$, $AL2_3$), and AL1 (although alignment system AL1 is only one system, it is referred to as a set here). However, alignment system $AL2_4$ or alignment system $AL2_1$ may also be used alone for detection of the marks. These five alignment systems AL1 and $AL2_1$ to $AL2_4$ can be grouped as; alignment systems ($AL2_1$, AL1), ($AL2_2$, $AL2_3$), and $AL2_4$, or alignment systems ($AL2_2$, $AL2_3$), (AL1, $AL2_4$), and $AL2_1$.

In the case of these groups, the spacing in the X-axis direction between the two alignment systems that perform parallel detection are to be D2=2D=104 in both cases.

Figure 16:
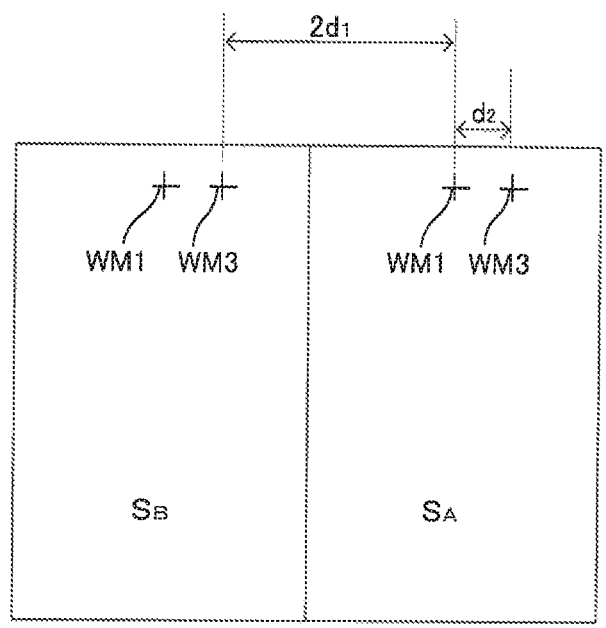
FIG. 16 is a view used to explain an example of a layout of alignment marks on a wafer suitable for alignment measurement performed in the case of employing another grouping of the five alignment systems.

In such a case, in the parallel detection using either sets of the alignment systems, the detection target is to be the two marks making a set that are arranged apart by $2d_1$=16 mm in the X-axis direction. For example, as is shown in FIG. 16, the spacing in the X-axis direction between mark WM1 within shot area $S_A$ and mark WM3 within the adjacent shot area $S_B$ Cis $2d_1$. In this case, only one set of mark WM1 and mark WM3 (or WM2) whose spacing in the X-axis direction is $d_2$=4 mm has to be provided in each shot area. In this case as well, the relation D2=5w+$d_2$ is established, and it can be seen that $d_2$ is a remainder when spacing D2 between each of the alignment systems used in parallel detection is divided by w.

As is described so far, according to the alignment measurement (mark detection method) performed in exposure apparatus 100, since a plurality of alignment marks arranged in the X-axis direction on wafer W are detected a plurality of times, e.g. three times, using the five alignment systems AL1 and $AL2_1$ to $AL2_4$, in one detection, detection of the alignment mark using one alignment system or parallel detection of the alignment marks using two alignment systems is performed. More specifically, four alignment systems $AL2_1$ to $AL2_4$ of the five alignment systems AL1 and $AL2_1$ to $AL2_4$ that exclude a predetermined alignment system, e.g. alignment system AL1, are grouped into two sets (e.g. alignment systems $AL2_1$ and $AL2_4$, and alignment systems $AL2_2$ and $AL2_3$) with each set consisting of two different alignment systems forming a set, and parallel detection in which two alignment marks selected from the plurality of alignment marks on wafer W are detected is performed twice by respectively using each set of alignment systems, along with detection in which one alignment mark on wafer W is detected using alignment system AL1. In this case, the plurality of alignment marks are formed on wafer W, along with the plurality of shot areas being formed arranged two-dimensionally in the X-axis direction and the Y-axis direction. The plurality of alignment marks, which are repeatedly arranged along the X-axis direction at a spacing of the length in the X-axis direction of the shot area, include a plurality of sets of alignment marks to which at least two marks respectively belong that are arranged apart in the X-axis direction only by a remainder when the distance (spacing) in the X-axis direction between alignment systems in each set is divided by the length of the shot area in the X-axis direction. Then, from the plurality of sets alignment marks, two alignment marks are selected as the subject for detection of the alignment detection systems in each set.

Accordingly, in the alignment measurement (mark detection method) performed with exposure apparatus 100, each of the plurality of (five) alignment systems AL1 and $AL2_1$ to $AL2_4$ can employ a fixed alignment system. As a result, it becomes possible to reduce cost and to improve space efficiency inside the exposure apparatus than when employing a movable alignment system as at least one of the plurality of alignment systems. As an example of the latter case of improving space efficiency, for example, since it will be possible to increase the diameter of the optical system that the alignment system has, it becomes possible to employ an optical system having a large numerical aperture N. A., or to incorporate an adjustment mechanism such as for image forming characteristics inside the optical system.

In addition to this, since mark detection by the alignment system is performed only by no more than two alignment systems in one detection, it becomes possible to perform mark detection (alignment measurement; with high precision that is hardly affected by issues such as unevenness of the wafer surface, or focus error (or accuracy in focusing) between, alignment systems AL1 and $AL2_1$ to $AL2_4$.

Also, in exposure apparatus 100, because exposure is performed on the plurality of shot areas on wafer W by the step-and-scan method driving wafer stage WST based on the results of the highly precise detection of the marks described above, exposure with high precision (exposure with good overlay accuracy) becomes possible.

Also, since a layout method is employed in which the arrangement in the X-axis direction of the alignment marks on wafer w is decided taking into consideration the spacing in the X-axis direction of the plurality of alignment systems mutually and the length in the X-axis direction of the shot area, only a minimum number of alignment marks, or specifically, two, in the case when the spacing in the X-axis direction, of the two alignment systems forming a set used in parallel detection is equal in each set, or three, in the case when the spacing includes different spacing D1 and D2, alignment marks have to be arranged in each shot area.

Note that the layout method of the marks on the wafer described above can also be suitably applied to wafers that are subject to exposure by exposure apparatuses that have a plurality of alignment systems including a fixed alignment system and a movable alignment system as is disclosed in, for example, U.S. Pat. Nos. 8,432,534, 8,054,472 and the like. In these exposure apparatuses as well, it becomes possible to effectively perform detection using the plurality of alignment systems by moving the plurality of alignment marks on the wafer while moving the wafer (wafer stage) within the XY plane after the position of the movable alignment system is set once according to a shot map. Note that, adjusting the position of the alignment system includes adjusting the position within the XY plane of the detection center (detection area) of the alignment system by moving a member (e.g. at least one optical member) that structures the alignment system.

Note that while the case has been described when five alignment systems are provided in the embodiment above, the embodiment is not limited to this, and the alignment system provided may be of any number as long as it is two or more. For example, in the case seven (or nine) alignment systems are provided at an equal spacing D in the X-axis direction, six (or eight) alignment systems excluding a predetermined alignment system of the seven (or nine) alignment systems may be grouped into three sets (or four sets) with each set consisting of two different alignment systems forming a set, and parallel detection in which two alignment marks selected from the plurality of sets of alignment marks are concurrently detected may be performed three times (or four times) by respectively using each set of alignment systems, along with detection in which one mark on the wafer is detected using the predetermined alignment system.

As is obvious from the description so far, in the case N (N is an odd number) alignment systems are provided at a predetermined spacing in the X-axis direction, (N−1) alignment systems excluding a predetermined alignment system of the N alignment, systems may be grouped into (N−1)/2 sets with each set consisting of two different alignment systems forming a set, and parallel detection in which two alignment marks selected from the plurality of sets of alignment marks are concurrently may be performed (N−1)/2 times by respectively using each set of alignment systems, along with detection in which one mark on the wafer is detected using the predetermined alignment system.

Note that since the case when N is an even number corresponds to the case in which a predetermined alignment system is not available when N is an odd number, mark detection is performed in the same procedure as in the case when N is an odd number with the detection using the predetermined one alignment system being omitted. That is, in the case when N is an even number, parallel detection may be performed N/2 times, in which two marks selected from the plurality of sets of alignment marks repeatedly arranged along the X-axis direction at a spacing of the length, in the X-axis direction of the shot area on the wafer are concurrently detected, using the alignment systems forming a set with two different alignment systems.

Note that in the embodiment above, of alignment systems AL1 and $AL2_1$ to $AL2_4$ t while the case has been described where remainder $d_1$ and $d_2$ when spacing D1 and D2 between detection centers of the two alignment systems of each set used in the parallel detection are divided by width w in the X-axis direction of the respective shot areas are both not zero (null) (that is, in the case spacing D1 and D2 are not integer multiples of width w), at least one of remainder $d_1$ and $d_2$ may be zero. That is, spacing D1 and D2 may be integer multiples of width w.

Figure 17:
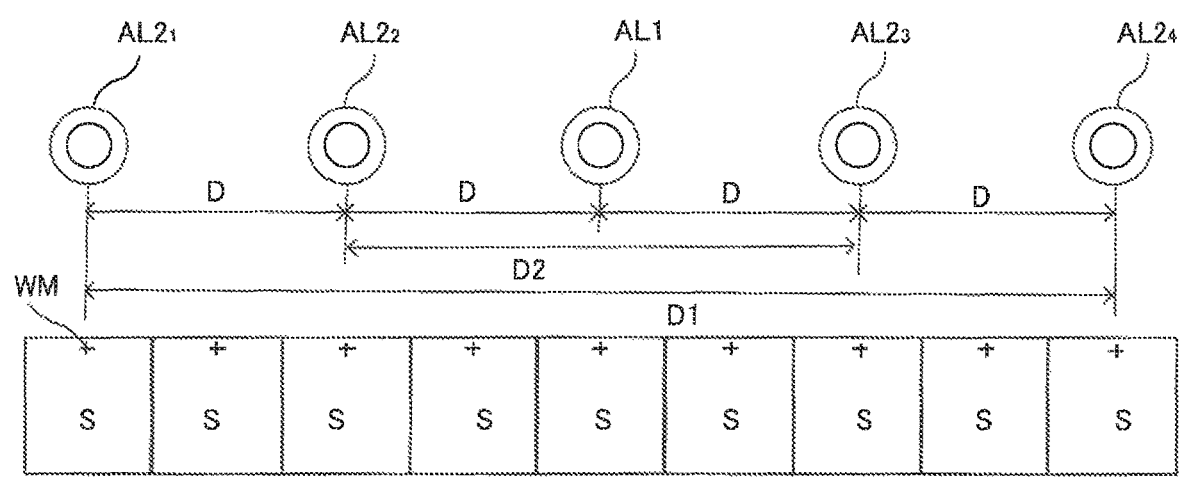
FIG. 17 is a view used to explain an example of a layout of alignment marks on a wafer in the case remainders $d_1$ and $d_2$ when spacing D1 and D2 between detection centers of two alignment systems of each set used in parallel detection of alignment systems AL1 and $AL2_1$ to $AL2_4$ are divided by width w in the X-axis direction of each shot area are both zero.
Figure 17:
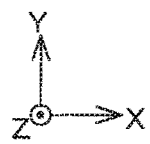

For example, of alignment systems AL1 and $AL2_1$ to $AL2_4$, in the case spacing D1 and D2 between detection centers of the two alignment systems of each set used in the parallel detection can be divided by width w in the X-axis direction of each snot area without any remainders, as is shown in FIG. 17 as an example, only one mark WM has to be formed in each snot area, at the same position within each shot area S. In this case, unlike the embodiment above where a mark at a position within a shot area (divided area) and a mark at a different position within another shot area could, be concurrently detected, a mark at the same position are to be detected concurrently within a shot area (divided area) and another shot area.

The point is, a set of alignment systems is to be decided that can perform parallel detection of the marks arranged in each of the plurality of shot areas (divided areas) arranged, based on spacing D (such as D1 and D2) between detection centers of the two alignment systems of each set used in the parallel detection and width w in the X-axis direction of the shot area, and in each of the cases when the number of alignment systems N is an odd number and when N is an even number, by respectively using each set of alignment systems as is described above, parallel detection, of concurrently detecting the two marks selected from the plurality of sets of alignment marks previously described is to be performed (N−1)/2 times or N/2 times. In the case of performing parallel detection (N−1)/2 times, in addition to this, a mark on the wafer is to be detected using a predetermined alignment system.

Note that in the embodiment above, an example was described of a case in which an FIA (Field Image Alignment) system of an image processing method was used as each alignment system, however, the embodiment is not limited to this, and an alignment system of a diffraction light interference method may be used that detects position information of a grating mark by irradiating the grating mark with a measurement light (measurement beam) while a wafer on which a grating mark is formed is moved and detecting a plurality of diffracted lights generated from the grating mark. As for the alignment system of the diffraction light interference method, the system, is disclosed in, for example, U.S. Pat. No. 7,319,506 in detail.

Note that in the case of employing the alignment system of the diffraction light interference method, the detection center (detection position) can be set by the irradiation position of the measurement beam, and spacing D between detection centers can be set by the spacing between irradiation positions of the measurement beams. Also in the case of employing the alignment system of the diffraction light interference method, spacing D between detection centers may be a designed distance determined in advance, a distance measured using a measurement member (e.g., FD bar 46) provided at wafer table WTB, or a distance measured using a sensor provided at wafer table WTB.

Figure 18A:
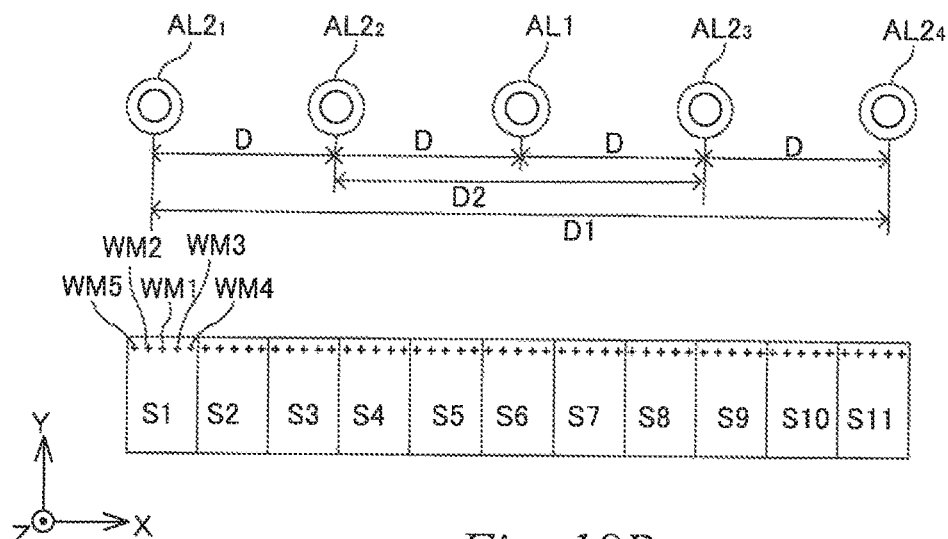
FIGS. 18A to 18F are views used to explain detection of marks in the case an alignment system of a diffraction light interference method is used as alignment systems AL1 and $AL2_1$ to $AL2_4$.
Figure 18B:
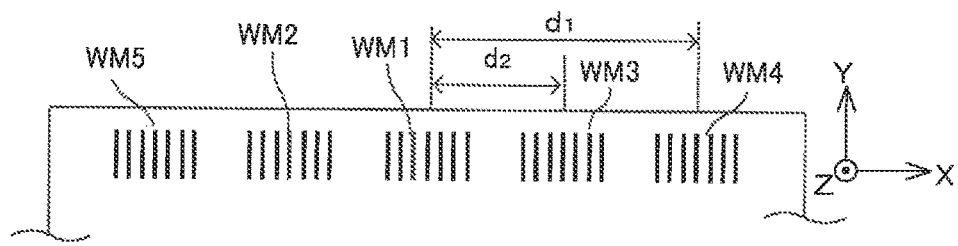
Figure 18C:
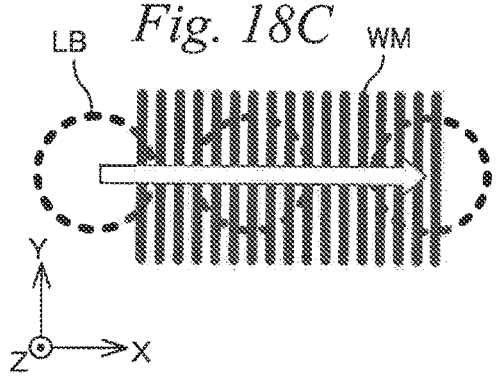

FIG. 18A shows a row of eleven shot areas S1 to S11 on wafer W which are extracted, along with alignment systems AL1 and $AL2_1$ to $AL2_4$ consisting of alignment systems of the diffraction light interference method that have the same arrangement as the five alignment systems in FIG. 13A. Also, FIG. 18B shows a part of a shot area in FIG. 18A enlarged. As it can be seen from FIG. 18B, as each mark WM1 to WM5, a linear grating mark whose periodic direction is in the X-axis direction is used. In this case, to detect position information of mark WM (WM1 to WM5), as is conceptually shown in FIG. 18C, a plurality of diffracted lights generated from mark WM is to be detected with alignment systems AL1 and $AL2_1$ to $AL2_4$, while mark WM (wafer) is relatively moved in the periodic direction (X-axis direction) with respect to measurement beam LB. Note that in FIG. 18C, although it is shown that measurement beam LB is moving with respect to a fixed mark WM for convenience of illustration, the irradiation position of measurement beam LB is actually fixed and mark WM (wafer) is moved in a direction opposite to the outlined arrow.

Also in this case, the relations D1/w=10w+$d_1$ (=8 mm) and D2/w=5w+$d_2$ (=4 mm) are established. Accordingly, also in this case, detection (measurement of position information) of marks WM1 to WM5 can be performed using the three sets of alignment systems (($AL2_1$, $AL2_4$), ($AL2_2$, $AL2_3$), AL1) as is previously described.

Figure 18D:
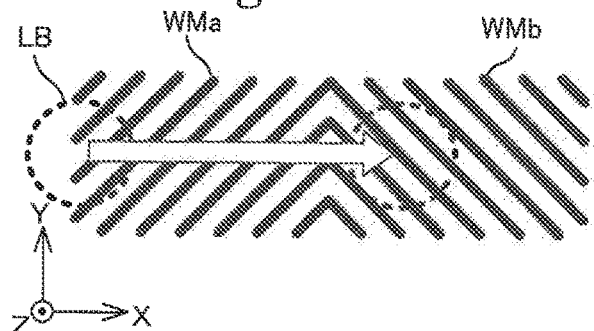
Figure 18E:
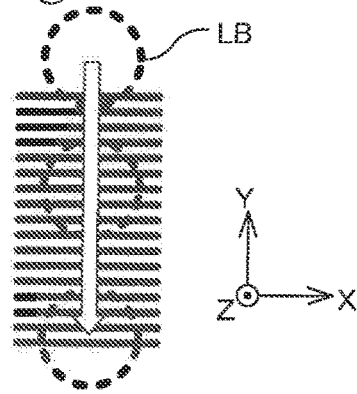
Figure 18F:
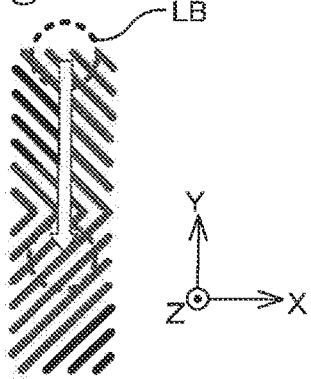

Note that mark MW is not limited to the grating mark whose periodic direction is in the X-axis direction, and a two-dimensional mark consisting of a one-dimensional mark WMa whose periodic direction is in a direction tilted by +45 degrees with respect to the X-axis and a one-dimensions mark WMb whose periodic direction is in a direction tilted by −45 degrees with respect to the X-axis may be used, as is shown in FIG. 18D. In this case as well, diffracted lights generated from the two-dimensional marks should be detected by alignment systems AL1 and $AL2_1$ to $AL2_4$ while the wafer is moved in the X-axis direction at the time of measurement. Also, as is shown respectively in FIGS. 18E and 13D, the one-dimensional grating mark and the two-dimensional grating mark may be arranged so that alignment systems AL1 and $AL2_1$ to $AL2_4$ may perform detection operation of the marks while the wafer is moved in the Y-axis direction with respect to the measurement beam. In any case, detection (measurement of position information) of marks WM1 to WM5 can be performed using the three sets of alignment systems (($AL2_1$, $AL2_4$), ($AL2_2$, $AL2_3$), AL1) as is previously described.

Note that in the case of using a one-dimensional mark as is shown in FIG. 18B, WM1 to WM5 may be arranged based on $d_1$ and $d_2$ with the center position in the X-axis direction of the grating mark serving as the position in the X-axis direction of the grating mark, or WM1 to WM5 may be arranged based on $d_1$ and $d_2$ with a position at one of the edges in the X-axis direction of the grating mark serving as the position in the X-axis direction of the grating mark. Also, in the case of using a two-dimensional mark as is shown in FIG. 18D, WM1 to WM5 may be arranged based on $d_1$ and $d_2$ with the border between the grating marks WMa and WMb in the X-axis direction serving as the position in the X-axis direction of the grating mark, or WM1 to WM5 may be arranged based on $d_1$ and $d_2$ with a position at one of the edges in the X-axis direction of the grating mark serving as the position in the X-axis direction of the grating mark.

Also, an alignment system of a diffraction light interference method that performs mark detection while changing the irradiation position of measurement beam LB may be employed. In this case, relative movement of measurement beam LB and the grating mark may be performed moving measurement beam LB in a state where the wafer is stopped, or relative movement of the measurement beam and the grating mark may be performed by moving both measurement beam LB and the wafer.

Note that the alignment system that involves with the relative movement between the measurement beam and the alignment mark is not limited to the alignment system of the diffraction light interference method.

Figure 19A:
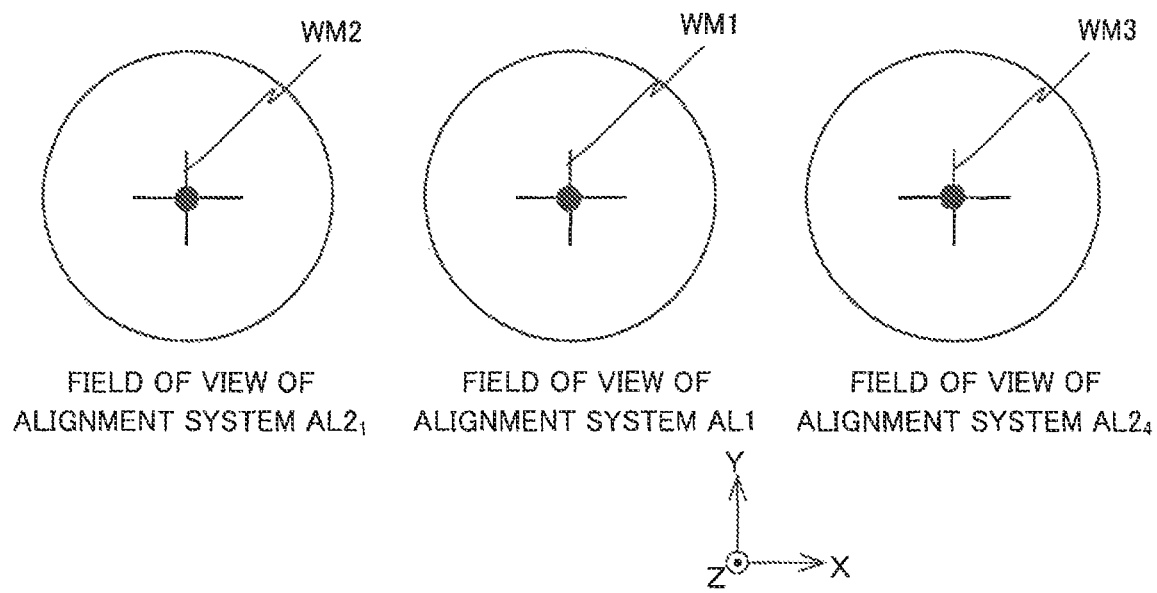
FIG. 19A is a view showing an example of a positional relation between mark WM2 and mark WM3 and each detection center of alignment system $AL2_1$ and alignment system $AL2_4$ consisting of FIA systems, respectively, in the case marks WM2 and WM3 subject to parallel detection by alignment systems $AL2_1$ and $AL2_4$ are arranged at design positions decided by remainder $d_2$.
Figure 19B:
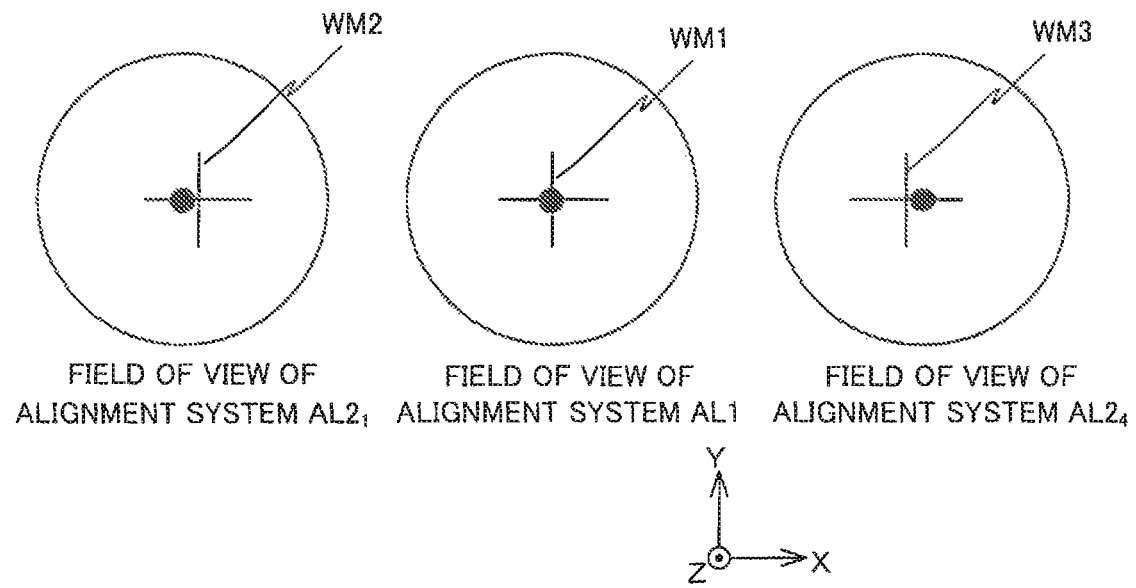
FIG. 19B is a view showing an example of a positional relation between mark WM2 and mark WM3 and each detection center of alignment system $AL2_1$ and alignment system $AL2_4$ in the case mark WM2 and mark WM3 are shifted from the design position decided by remainder $d_2$.

Note that in the embodiment above, of alignment systems AL1 and $AL2_1$ to $AL2_4$, the case has been described where position relation of marks WM1 to WM5 is set according to remainders $d_1$ and $d_2$ when spacing D1 and D2 between detection centers of the two alignment systems of each set used in the parallel detection are divided by width w in the X-axis direction of the respective shot areas, that is, the case when each of the marks WM1 to WM5 is formed at a position decided by remainders $d_1$ and $d_2$. However, in the case of alignment systems AL1 and $AL2_1$ to $AL2_4$ of the imaging method, if the mark subject to detection is located within the detection area (detection field), then the mark can be detected. Accordingly, this may be taken into consideration when designing the mark position. That is, position relation of marks WM1 to WM5 may be set, based on spacing D1 and D2 between detection centers of the two alignment systems of each set used in the parallel detection, width w in the X-axis direction of one shot area, size of detection field of each of the alignment systems AL1 and $AL2_1$ to $AL2_4$, and size of marks. That is, position relation of marks WM1 to WM5 may be set, based on remainders $d_1$ and $d_2$ when spacing D1 and D2 between detection centers of the two alignment systems of each set used in the parallel detection are divided by width w in the X-axis direction of the respective shot areas, size of detection field of each, of the alignment systems AL1 and $AL2_1$ to $AL2_4$, and size of marks. For example, when mark WM2 and mark WM3 subject to parallel detection by alignment systems $AL2_1$ and $AL2_4$ are at a design position decided by remainder $d_2$, at the time of parallel detection, as shown in FIG. 19A, the center of marks WM2 and WM3 (shown in a cross in the drawing) almost coincides with each detection center (shown in a black circle in the drawing) of alignment systems $AL2_1$ and $AL2_4$. However, for example, in the case mark WM2 and mark WM3 are shifted, from the design position decided by remainder $d_2$, for example, as is shown in FIG. 19B, the detection center of marks WM2 and WM3 subject to parallel detection by alignment systems $AL2_1$ and $AL2_4$ shifts slightly from the detection center of alignment systems $AL2_1$ and $AL2_4$, however, this shift amount is known, and as long as the marks do not protrude from the detection field of the alignment systems, the center position of marks WM2 and WM3 can be measured. Note that as long as the marks are within the detection field of the alignment systems, position shift of the marks is not limited to the X-axis direction with respect to the detection center, and may be shifted in the Y-axis direction or in any other directions.

Note that in FIGS. 19A and 19B, a relation of mark WM1 detected solely by alignment system AL1 with the detection center of alignment system AL1 is shown in the middle for comparison.

Figure 20A:
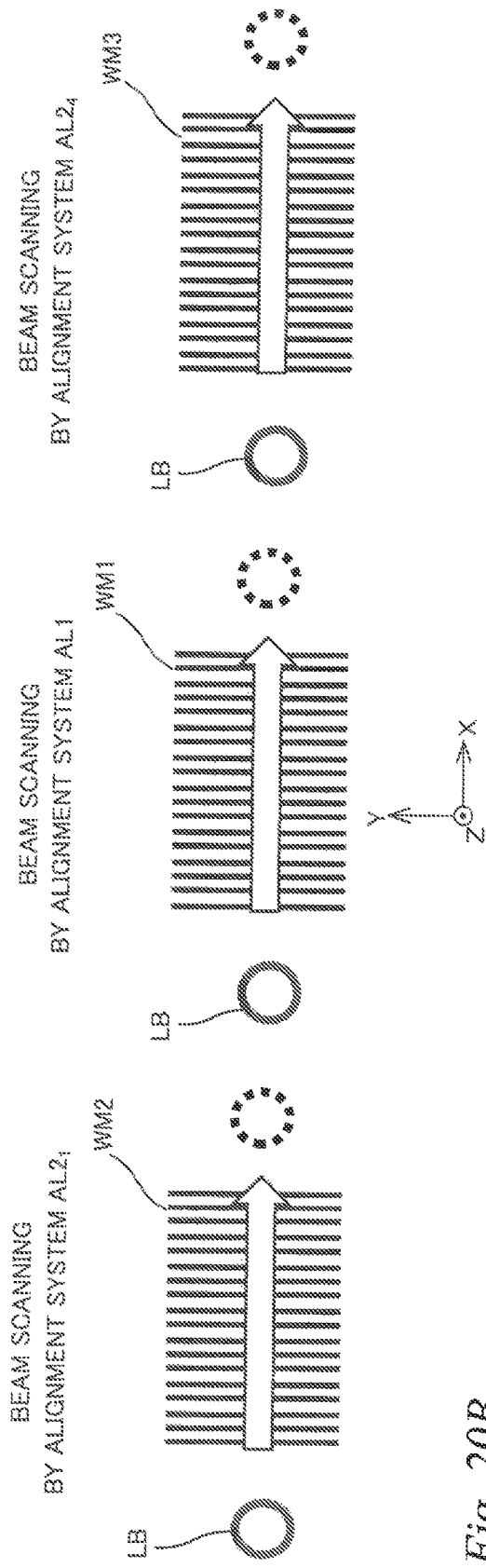
FIG. 20A is a view used to explain a scanning range of measurement beams with respect to mark WM2 and mark WM3 in the case mark WM2 and mark WM3 subject to detection by alignment system $AL2_1$ and alignment system $AL2_4$ consisting of alignment systems of a diffraction light interference method are arranged, at design positions decided by remainder $d_2$.

In the case of the alignment systems of the diffraction light interference method as well, position relation of marks WM1 to WM5 is to be set, based on spacing D1 and D2 between detection centers of the two alignment systems of each set used in the parallel detection and width w in the X-axis direction of the respective shot areas. That is, position relation of marks WM1 to WM5 is to be set, according to remainders $d_1$ and $d_2$ when spacing D1 and D2 between detection centers (beam irradiation position) of the two alignment systems of each set used in the parallel detection are divided by width w in the X-axis direction of the respective shot areas. Accordingly, for example, when mark WM2 and mark WM3 subject to parallel detection by alignment systems $AL2_1$ and $AL2_4$ are at a design position decided by remainder $d_2$, at the time of parallel detection, positional relation between the detection center of alignment system $AL2_1$ and mark WM2 and the positional relation between the detection center of alignment system $AL2_4$ and mark WM3 can be made to substantially coincide, and as is shown in FIG. 20A, in both marks WM2 and WM3, the entire area in the periodic direction is scanned respectively by measurement beams LB of alignment systems $AL2_1$ and $AL2_4$. FIG. 20A shows this by indicating that the scanning starting point and the scanning ending point of measurement beam LB are symmetric with respect to the center of each mark.

Figure 20B:
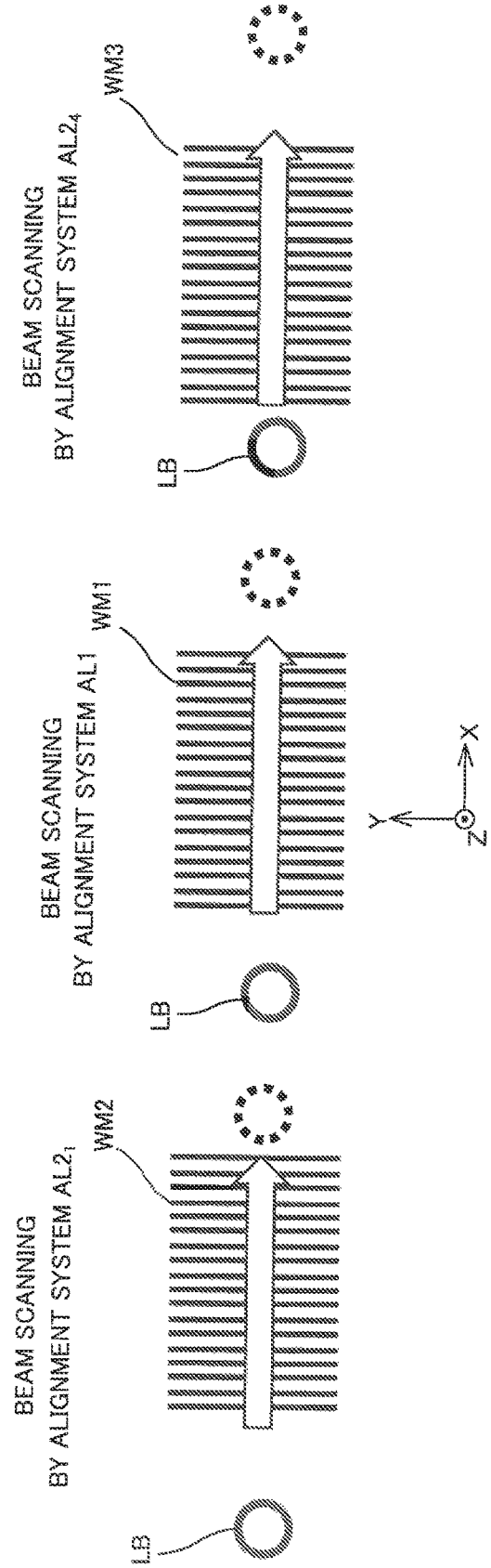
FIG. 20B is a view used to explain a scanning range of measurement beams with respect to mark WM2 and mark WM3 in the case mark WM2 and mark WM3 are shifted from the design position decided by remainder $d_2$.

However, for example, mark WM2 and mark WM3 by be shifted from the design position decided from remainder $d_2$. For example, in FIG. 20B, mark WM2 detected by alignment system $AL2_1$ is arranged shifted to the +X direction from the position decided from remainder $d_2$, and mark WM3 detected by alignment system $AL2_4$ is arranged shifted to the −X direction from the position decided from remainder $d_2$. In this case, as is shown in FIG. 20B, although positional relation between measurement beam LB of alignment system $AL2_1$ and mark WM2 differs from positional relation between measurement beam LB of alignment system $AL2_4$ and mark WM3, if the respective measurement beams of alignment systems $AL2_1$ and $AL2_4$ used for parallel detection can scan mark WM2 and WM3 covering a distance required for position measurement, then position measurement of the marks is possible. Accordingly, mark WM2 and mark WM3 can be shifted from the position determined by remainder $d_2$. That is, position relation of marks WM1 to WM5 may be set, based on spacing D1 and D2 between detection centers of the two alignment systems of each set used, in the parallel detection, width w in the X-axis direction of the respective shot areas, size of marks, relative moving distance of the measurement beams and the marks (wafer) and the like. That is, position relation of marks WM1 to WM5 may be set, based on remainders $d_1$ and $d_2$ when spacing D1 and D2 between detection centers of the two alignment systems of each set used in the parallel detection are divided by width w in the X-axis direction of the respective shot areas, size of marks, relative moving distance of the measurement beams and the marks (wafer) and the like.

Note that, in FIGS. 20A and 20B, a state of scanning of measurement beam LB with respect to mark WM1 detected solely by alignment system AL1 is shown in the middle for comparison.

Note that as is shown in FIGS. 20A and 20B, in the case of scanning the grating marks (e.g. WM2 and WM3) with the measurement beam, while it is preferable for the measurement beam to pass over the edges of the marks on both sides in the periodic direction, position measurement of the marks is possible even when the measurement beam only passes over the edge on one side. Also, in the case scanning is started in a state where the measurement beam is irradiated crossing over the edge on one side in the periodic direction of the mark and the scanning ends in a state where the measurement beam, crosses over the edge on the other side, position measurement of the mark may be possible in some cases. Also, in the case scanning is started, in a state where the measurement beam is irradiated, crossing over the edge on one side in the periodic direction of the mark and the scanning ends with the measurement beam not irradiating the edge on the other side, or in the case scanning is started, with the measurement beam not irradiating the edge on one side in the periodic direction of the mark and the scanning ends in a state where the measurement beam is irradiated crossing over the edge on the other side, position measurement of the mark may be possible in some cases.

Note that in the case of the mark tilted by 45 degrees, if mark WMa tilted by +45 degrees with respect to the X-axis and mark WMb tilted by −45 degrees with respect to the X-axis can each be scanned by a distance required for position measurement, with respect to measurement beam LB, the arrangement of the marks may be shifted from the positions decided from remainders $d_1$ and $d_2$.

Note that in FIG. 20, although measurement beam LB and wafer W relatively move so that measurement beam LB moves over the grating marks in the +X direction, measurement beam LB and wafer W may relatively move so that measurement beam LB moves over the grating marks in the −X direction. Also, in a detection operation of one set in the parallel detection, measurement beam LB and wafer W may be relatively moved, so that measurement beam LB is moved over the grating marks in the +X direction, and in a detection operation of the other set, measurement beam LB and wafer W may be relatively moved so that measurement beam LB is moved over the grating marks in the −X direction.

Note that in the embodiment described above, "parallel detection" includes not only the case when detection operation period of the plurality of alignment systems included in one set completely coincides with one another, but also the case when part of detection operation period of an alignment system (e.g. $AL2_2$) and part, of detection operation period of another alignment system (e.g. $AL2_3$) included in one set overlap each other.

Also, "parallel detection" does not have to be performed. That is, detection operation of one alignment system (e.g. $AL2_2$) included in one set may be completed, then after this, detection operation of another alignment system (e.g. $AL2_3$) may be performed.

Also, in the embodiment described above, while the plurality of alignment marks are arranged in each shot area based on remainders $d_1$ and $d_2$, in the case remainders $d_1$ and $d_2$ when spacing between detection centers (D1 and D2) of the two alignment systems of each set used in the parallel detection are divided by width w in the X-axis direction of the respective shot areas are not zero, mark detection operation of the alignment systems may be controlled based on spacing between detection centers (D1 and D2) of the two alignment systems and width w in the X-axis direction of the respective shot areas. That is, detection operation using the alignment systems may be controlled based on remainders $d_1$ and $d_2$. In this case, for example, the plurality of alignment marks WM2, WM3, WM4, and WM5 do not have to be arranged based on remainders $d_1$ and $d_2$.

Figure 21A:
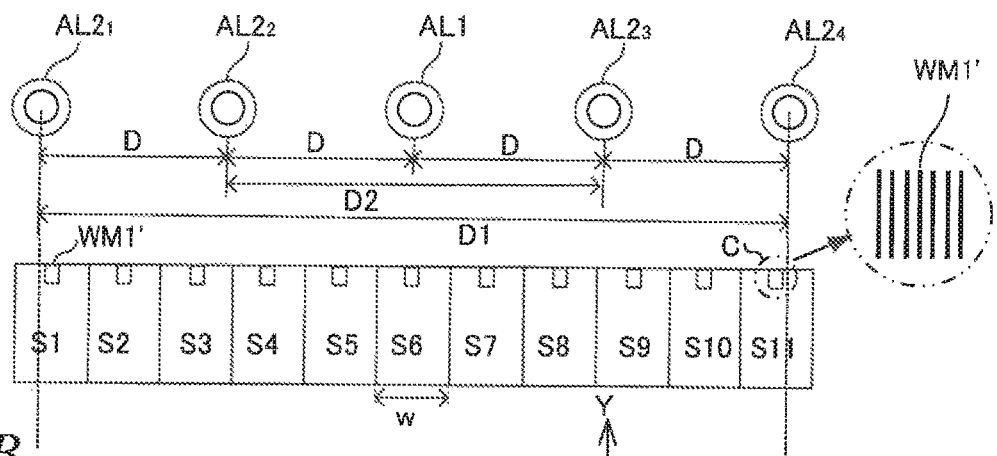
FIG. 21A is a view used, to explain another example of detection of marks on a wafer by alignment systems consisting of an alignment system of a diffraction light interference method, showing an example of a layout of alignment marks on a wafer along with an arrangement of alignment systems.

For example, in the case of using the alignment system of the diffraction light interference method described above, as is shown in FIG. 21A which representatively focuses on shot areas S1 to S11, a grating mark WM1' (refer to an enlarged view of circle C in FIG. 21A) may be provided in each shot area Ai and a detection operation of scanning the grating mark with measurement beam LB may be controlled based on remainders $d_1$ and $d_2$. Controlling the detection operation includes controlling at least one of timing when irradiation of measurement beam LB begins (position on wafer W where irradiation of measurement beam LB begins), timing when irradiation of measurement beam LB ends (position on wafer W where irradiation of measurement beam LB ends), distance of measurement beam LB scanning wafer W (moving distance of wafer W), and relative speed between the measurement beam and the grating mark (wafer W).

Figure 21B:
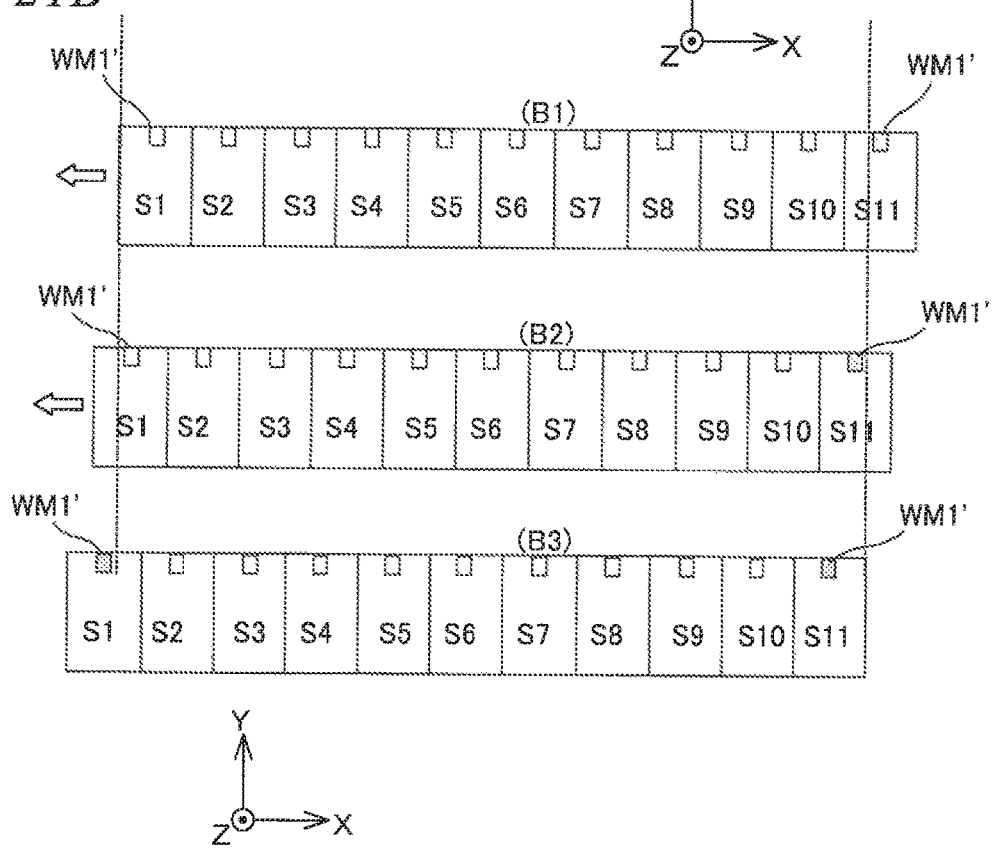
FIG. 21B is a view used to explain a detection method of the marks on the wafer in FIG. 21A.

For example, as is shown in FIG. 21B, in the case of detecting alignment mark WM1' of shot area S11 with alignment system $AL2_4$ and detecting alignment mark WM1' of shot area S1 with alignment system $AL2_1$ while moving wafer W in the −X direction, for example, detection operation from moving wafer W in the −X direction from a state (refer to B1 in FIG. 21B) in which alignment system $AL2_4$ irradiates the −X side of alignment mark WM1' in shot area S11 with a measurement beam, the measurement beam of alignment system. $AL2_4$ passing over alignment mark WM1' of shot area S11 (refer to B1 in FIG. 21B), the measurement beam of alignment system $AL2_1$ further passing over alignment mark WM1' of shot area S1, and until a state (refer to B3 in FIG. 21B) in which alignment system $AL2_1$ irradiates the +X side of alignment mark WM1' in shot area S1 with a measurement beam, can be controlled based on remainder $d_2$.

Note that when executing the detection operation of FIG. 21B, the moving speed of wafer W during the period from the beginning of scanning of mark WM1' with the measurement beam of alignment system $AL2_4$ until the end of scanning of mark WM1' with the measurement beam of alignment system $AL2_1$ may be constant or may be changed. For example, since the timing which the mark is scanned by the measurement beam can be controlled according to remainder $d_2$, moving speed (expressed as Vd) of the wafer during the period when the mark is scanned by the measurement beam may be made smaller than the moving speed (expressed as Vnd) of wafer W during the period when neither of the alignment systems are scanning the mark (e.g. the period after the mark has been scanned by the beam of alignment system $AL2_4$ until the beginning of scanning of the mark by the measurement beam of alignment system $AL2_1$). Also, in the case of executing detection, operation like FIG. 21B, mark scanning period by the beam of alignment system $AL2_4$ may overlap part of mark scanning period, by the measurement beam of alignment system $AL2_1$.

Also, in the case of executing detection operation like FIG. 21B, after alignment mark WM1' in shot area S11 is detected with alignment system $AL2_4$ and alignment mark WM1' in shot area S1 is detected with alignment system $AL2_1$ while wafer W is moved in the −X direction, alignment mark WM1' in shot area S3 may be detected, with alignment system $AL2_2$ and alignment mark WM1' in shot area S9 may be detected with alignment system $AL2_3$ while wafer W is moved in the +X direction. In this case, the detection operation of each alignment mark WM1' in shot areas S1, S3, S9, and S11 with alignment systems $AL2_2$, $AL2_2$, $AL2_3$, and $AL2_4$ may be controlled, based on remainders $d_1$ and $d_2$.

Note that while the case has been described where spacing between detection centers of the plurality of alignment systems is equal in the embodiment above, the spacing does not necessarily have to be equal. For example, in the case of an alignment system consisting of an FIA system, it is obvious from the description so far that there are no problens in particular if dispersion of spacing is at an extent smaller than the size of the respective detection fields.

Further, on detection, the number of measurement points of the marks may be increased by increasing the number of X stepping to move wafer W in the X-axis direction by stepping movement. That is, the number of alignment shots may be increased. For example, all the shot areas on wafer W may serve as an alignment shot area. Also, by the X stepping, measurement of a plurality of points of the marks may be executed within a shot area.

Also, the position in the Y-axis direction of the alignment mark within the shot area is not limited to the embodiment described above. For example, the alignment mark may be placed near the edge in the −Y direction side of the shot area.

Also, the alignment mark detected with the alignment systems in the embodiment described above may be a mark used in a superposition inspection device (overlay inspection device).

Also, in the embodiment described above, while the case has been described where marks at different positions in different shot areas are concurrently measured at once using two alignment systems, if parallel detection of the marks using three or more alignment systems is possible, then such mark detection operation may be performed, or if the plurality of alignment systems can all perform parallel detection of the marks, then such mark detection operation may be performed. For example, in the embodiment described above, if flatness of the wafer is good, then parallel detection of the marks may be performed in all alignment systems AL1 and $AL2_1$ to $AL2_4$.

Also, the embodiment described above can also be applied to a TTL alignment system that detects a mark via a part of lenses including at least a front lens located at a position closest to an image plane of each lens in an exposure apparatus having a multi-lens optical system (including an optical system of a multi-column type). Details on such TTL alignment system are disclosed in, for example, U.S. Pat. Nos. 5,151,750, 6,242,754 and the like.

Also, in the embodiment described, above, the plurality of marks detected, by alignment systems AL1 and $AL2_1$ to $AL2_4$ may be a plurality of marks formed on a layer one layer before the layer on which exposure is performed based on the detection results, or may be a plurality of marks formed further on a lower layer.

Also, in the embodiment described above, while the plurality of mark detection systems (alignment systems AL1 and $AL2_1$ to $AL2_4$) are installed in exposure apparatus 100, the plurality of mark detection systems may be installed in a measurement device arranged, external to exposure apparatus 100 and may perform a mark detection operation like the ones described above. Details of the measurement device arranged external to exposure apparatus 100 are disclosed in, for example, U.S. Pat. No. 4,861,162 and the like.

Also, in the embodiment described above, the marks formed in each shot area. (e.g. WM1, WM2, WM3, WM4, and WM5) may be formed on scribe lines of each shot area, and length w of the shot areas may include the scribe lines.

Note that in the case of using an encoder system instead of the interferometer system, or along with the interferometer system as the measurement device that measures position information of the wafer stage in the exposure apparatus, the encoder system, for example, is not limited to an encoder system structured having a grating section (scale) provided on a wafer table (wafer stage) and having an encoder head arranged external to the wafer stage facing the grating section, and an encoder system may be employed that is structured with an encoder head provided at a wafer stage and a grating section (e.g. a two-dimensional grating or a linear grating section arranged two-dimensionally) is placed external to the wafer-stage facing the encoder head, as is disclosed in, for example, U.S. Patent Application Publication No. 2005/0227309 and the like. In both encoder systems, the encoder head is not limited to a one-dimensional head, and not only a two-dimensional head whose measurement direction is in the X-axis direction, and the Y-axis direction, but also a sensor head whose measurement direction is in one of the X-axis direction and the Y-axis direction and in the Z-axis direction may be used. As the latter sensor head, a displacement measurement sensor head disclosed in, for example, U.S. Pat. No. 7,561,280 can be used. Or, a three-dimensional head, may be used, whose measurement direction is in three directions orthogonal, to three axes; the X-axis, the Y-axis, and the Z axis.

Also, in the embodiment described above, while the case has been described where the exposure apparatus is a dry type exposure apparatus that performs exposure of wafer W without using liquid (water), the exposure apparatus is not limited to this, and the embodiment described above can also be applied to an exposure apparatus having a liquid immersion space including an optical path of an illumination light formed between a projection optical system and a wafer that exposes the wafer with the illumination light via the projection optical system and liquid in the liquid immersion space, as is disclosed in, for example, European Patent Application Publication No. 1420298, International Publication WO 2004/055803, U.S. Pat. No. 6,952,253 and the like. Also, the embodiment described above can be applied to a liquid immersion apparatus or the like disclosed in, for example, U.S. Pat. No. 8,054,472.

Also, in the embodiment described above, while the case has been described where the exposure apparatus is a scanning exposure apparatus of a step-and-scan method, the embodiment is not limited to this, and the embodiment described above may also be applied to a static exposure apparatus such as a stepper. The embodiment described above can also be applied to a reduction projection exposure apparatus of a step-and-stitch method that synthesizes a shot area and a shot area, an exposure apparatus of a proximity method, a mirror projection aligner and the like. Furthermore, the embodiment described above can also be applied to a multi-stage type exposure apparatus equipped with a plurality of wafer stages, as is disclosed in, for example, U.S. Pat. Nos. 6,590,634, 5,969,441, 6,208,407 and the like. Also, the embodiment described above can be applied to an exposure apparatus equipped with a measurement stage including a measurement device (e.g. reference marks, and/or sensors) separately from a wafer stage, as is disclosed in, for example, U.S. Pat. No. 7,589,822 and the like.

Also, the projection optical system in the embodiment described, above is not limited to a reduction system, and may also either be an equal or a magnifying system, projection optical system PL is not limited to a refraction system and may also either be a reflection system or a catadioptric system, and the projection image may also either be an inverted image or an erected image. Also, while the illumination area and the exposure area previously described had a rectangular shape, the embodiment is not limited to this, and the shape may be, for example, an arc, a trapezoid, or a parallelogram.

Note that the light source of the exposure apparatus in the embodiment described above is not limited to the ArF excimer laser, and may also be a pulse laser light source such as a KrF excimer laser (output wavelength 248 nm), an $F_2$ laser (output wavelength 157 nm), an $Ar_2$ laser (output wavelength 126 nm), a Kr$_2$ laser (output wavelength 146 nm), or an ultra-high pressure mercury lamp that emits a bright line such as a g-line (wavelength 436 nm), i-line (wavelength 365 nm) or the like can also be used. Also, a harmonic generator of a YAG laser or the like can also be used. Other than this, as is disclosed in, for example, U.S. Pat. No. 7,023,610, a harmonic wave may be used, which is a single-wavelength laser beam in the infrared or visual region oscillated from a DFB semiconductor laser or a fiber laser as vacuum ultraviolet light that is amplified by a fiber amplifier doped by, e.g. erbium (or both erbium and ytterbium), and then is subject to wavelength conversion into ultraviolet light using a nonlinear crystal.

Also, in the embodiment described above, illumination light IL of the exposure apparatus is not limited to light with a wavelength of 100 nm or more, and of course, light with a wavelength less than 100 nm may be used. For example, in recent years, to form patterns which are 70 nm or smaller, an EUV exposure apparatus is being developed that uses SOR or plasma laser as a light source to generate EUV (Extreme Ultraviolet) light in the soft X-ray region (e.g. a wavelength range of 5 to 15 nm), as well as a total reflection reduction optical system and a reflective mask designed under this exposure wavelength (e.g. 13.5 nm). In this apparatus, since a structure in which scanning exposure is performed by synchronously scanning the mask and the wafer with an arc illumination can be considered, the embodiment described above can also be suitably applied to such a device. Other than this, the embodiment described above can also be applied to an exposure apparatus that uses charged particle beams such as an electron beam or an ion beam.

Also, in the embodiment described above, while a transmissive type mask (reticle) was used, which is a transmissive substrate on which a predetermined light shielding pattern (or a phase pattern or a light attenuation pattern) is formed, instead of this reticle, as is disclosed in, for example, U.S. Pat. No. 6,778,257, an electron mask (which is also called a variable shaped mask, an active mask or an image generator, and includes, for example, a DMD (Digital Micro-mirror Device) that is a type of a non-emission type image display device (spatial light modulator) or the like) which forms a light-transmitting pattern, a reflection pattern, or an emission pattern according to electronic data, of the pattern that is to be exposed may also be used.

Also, the embodiment described above can be suitably applied to an exposure apparatus (a lithography system) that forms a line-and-space pattern on a wafer, for example, by forming an interference fringe on the wafer.

Furthermore, as is disclosed in, for example, U.S. Pat. No. 6,611,316, the embodiment described above can also be applied to an exposure apparatus that synthesizes two reticle patterns via a projection optical system and almost simultaneously performs double exposure of one shot, area by one scanning exposure.

Note that an object on which a pattern is to be formed (an object subject to exposure irradiated with an energy beam) in the embodiment above is not limited to a wafer, and may be other objects such as a glass plate, a ceramic substrate, a film member, or a mask blank.

The application of the exposure apparatus is not limited to an exposure apparatus for fabricating semiconductor devices, and can be widely adapted to, for example, an exposure apparatus for fabricating liquid crystal devices, wherein a liquid crystal display device pattern is transferred to a rectangular glass plate, as well as to exposure apparatuses for fabricating organic ELs, thin film magnetic heads, image capturing devices (e.g., CCDs), micromachines, and DNA chips. In addition to fabricating microdevices like semiconductor devices, the embodiment described above can also be adapted to an exposure apparatus that transfers a circuit pattern to a glass substrate, a silicon, wafer, or the like in order to fabricate a reticle or a mask used by a light exposure apparatus, an EUV exposure apparatus, an X-ray exposure apparatus, an electron beam exposure apparatus, and the like. Also, the embodiment described above can also be adapted to an exposure apparatus that transfers a circuit pattern to a glass substrate, a silicon wafer, or the like in order to fabricate not only microdevices like semiconductor devices but also a reticle or a mask used in a light exposure apparatus, an EUV exposure apparatus, an X-ray exposure apparatus, an electron beam exposure apparatus, and the like.

Figure 22:
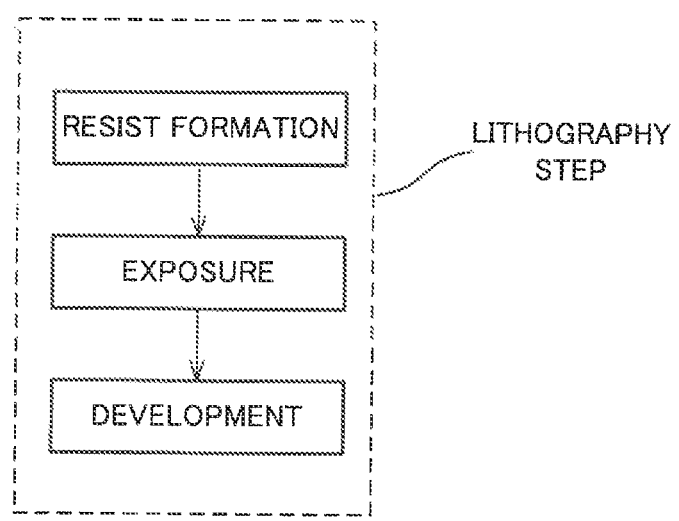
FIG. 22 is a view showing a lithography process used in manufacturing electronic devices such as semiconductors.

Electronic devices such as a semiconductor device are manufactured, as is shown in FIG. 22, through the steps of coating a resist (sensitive agent) on a wafer, exposing a wafer (sensitive object) using a reticle (mask) on which a pattern is formed, with an exposure apparatus (pattern forming apparatus) described earlier in the embodiment described above, and with a lithography step in which the wafer that has been, exposed is developed. In this case, highly integrated devices can be manufactured at high yield.

Note that other than the lithography step, the manufacturing process of semiconductor devices may include steps such as; a step for performing function/performance design of a device, a step for making a reticle (mask) based on this design step, a device assembly step (including a dicing process, a bonding process, and a package process), and an inspection step.

Note that the disclosures of all publications, International Publications, U.S. Patent Application Publications, and U.S. Patents related to exposure apparatuses and the like referred to so far in the description are incorporated herein by reference as a part of the present specification.

While the above-described embodiment of the present invention is the presently preferred embodiment thereof, those skilled in the art of lithography systems will readily recognize that, numerous additions, modifications, and substitutions may be made to the above-described embodiment without departing from the spirit and scope thereof. It is intended that all such modifications, additions, and substitutions fall within the scope, of the present invention, which is best defined by the claims appended below.

What is claimed is:

1. A mark detection method, comprising:
   providing a substrate; and
   by N mark detection systems, detecting a plurality of marks formed on the substrate using a layout method, N being a number of two or more,
   wherein the layout method comprises:
      determining, by a computer, an arrangement of at least one mark to be formed in each of a plurality of divided areas on the substrate, based on a detection position of each of the N mark detection systems and a length in a first direction of the divided area,
      wherein the plurality of divided areas are set in the first direction and a second direction intersecting each other on the substrate, and
      wherein the detection position of each of the N mark detection systems is fixed.

2. The mark detection method according to claim 1, wherein the at least one mark, the arrangement of which is determined by the computer, includes a plurality of marks arranged separately in the first direction, and a position where the plurality of marks arranged separately in the first direction is to be formed is substantially the same in each of the plurality of divided areas.

3. The mark detection method according to claim 2, wherein
the N mark detection systems include a first mark detection system and a second mark detection system, and
an arrangement of the plurality of marks to be formed in each of the plurality of divided areas is determined, by the computer, such that one mark of a plurality of marks formed in one divided area of the plurality of divided areas is detectable with the first mark detection system, and one mark of a plurality of marks formed in another divided area arranged separately in the first direction from the one divided area is detectable with the second mark detection system.

4. The mark detection method according to claim 3, wherein
the arrangement of the plurality of marks to be formed in each of the plurality of divided areas is determined, by the computer, such that detection using the second mark detection system is performed concurrently with detection using the first mark detection system.

5. The mark detection method according to claim 3, wherein
the arrangement of the plurality of marks to be formed in each of the plurality of divided areas is determined, by the computer, such that a position in the first direction within the one divided area of the mark detected with the first mark detection system is different from a position in the first direction within the another divided area of the mark detected with the second mark detection system.

6. The mark detection method according to claim 3, wherein
the arrangement of the plurality of marks to be formed in each of the plurality of divided areas is determined by the computer, based on a remainder when a distance in the first direction between a detection position of the first mark detection system and a detection position of the second mark detection system is divided by the length.

7. The mark detection method according to claim 1, wherein
the mark is a diffraction grating mark.

8. An exposure method, comprising:
detecting at least a part of the plurality of marks formed on the substrate using the mark detection method according to claim 1; and
moving the substrate based on detection results of the marks and exposing the plurality of divided areas with an energy beam.

9. A device manufacturing method, including:
exposing the substrate using the exposure method according to claim 8; and
developing the substrate which has been exposed.

10. A mark detection method, comprising:
providing a substrate; and
by N mark detection systems, detecting a plurality of marks formed on the substrate using a layout method, N being a number of two or more,
wherein the layout method comprises:
determining, by a computer, an arrangement of at least one mark to be formed in each of the plurality of divided areas on the substrate, based on a positional relationship between detection positions of the N mark detection systems in a first direction and a length of the divided area in the first direction,
wherein the plurality of divided areas are set in the first direction and a second direction intersecting each other on the substrate, and
wherein the respective detection positions of the N mark detection systems are fixed.

11. The mark detection method according to claim 10, wherein
the positional relationship includes a distance in the first direction between the detection positions of the N mark detection systems.

12. The mark detection method according to claim 10, wherein
the at least one mark, the arrangement of which is determined by the computer, includes a plurality of marks arranged separately in the first direction, and
a position where the plurality of marks arranged separately in the first direction is to be formed is substantially the same in each of the plurality of divided areas.

13. The mark detection method according to claim 12, wherein
the N mark detection systems include a first mark detection system and a second mark detection system, and
an arrangement of a plurality of marks to be formed in each of the plurality of divided areas is determined, by the computer, such that of one mark of a plurality of marks formed in one divided area of the plurality of divided areas is detectable with the first mark detection system, and one mark of a plurality of marks formed in another divided area arranged separately in the first direction from the one divided area is detectable with the second mark detection system.

14. The mark detection method according to claim 13, wherein
the arrangement of the plurality of marks to be formed in each of the plurality of divided areas is determined, by the computer, such that detection using the second mark detection system is performed concurrently with detection using the first mark detection system.

15. The mark detection method according to claim 13, wherein
the arrangement of the plurality of marks to be formed in each of the plurality of divided areas is determined, by the computer, such that a position in the first direction within the one divided area of the mark detected with the first mark detection system is different from a position in the first direction within the another divided area of the mark detected with the second mark detection system.

16. The mark detection method according to claim 13, wherein
the arrangement of a plurality of marks to be formed in each of the plurality of divided areas is determined by the computer, based on a remainder when a distance in the first direction between a detection position of the first mark detection system and a detection position of the second mark detection system is divided by the length.

17. The mark detection method according to claim 10, wherein
the mark is a diffraction grating mark.

18. An exposure method, comprising:
detecting at least a part of the plurality of marks formed on the substrate using the mark detection method according to claim 10; and
moving the substrate based on detection results of the marks and exposing the plurality of divided areas with an energy beam.

19. A device manufacturing method, including:
exposing the substrate using the exposure method according to claim 18; and
developing the substrate which has been exposed.

* * * * *